(12) United States Patent
Sasaki

(10) Patent No.: US 7,504,193 B2
(45) Date of Patent: Mar. 17, 2009

(54) POSITIVE RESIST COMPOSITION AND PATTERN FORMING METHOD USING THE SAME

(75) Inventor: Tomoya Sasaki, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 176 days.

(21) Appl. No.: 11/217,422

(22) Filed: Sep. 2, 2005

(65) Prior Publication Data

US 2006/0046195 A1 Mar. 2, 2006

(30) Foreign Application Priority Data

Sep. 2, 2004 (JP) ............ P.2004-255473

(51) Int. Cl.
*G03F 7/039* (2006.01)
(52) U.S. Cl. .................. 430/270.1; 430/326
(58) Field of Classification Search .......... 430/270.1, 430/907, 326, 176
See application file for complete search history.

(56) References Cited

U.S. PATENT DOCUMENTS 5,695,910 A * 12/1997 Urano et al. ............ 430/270.1
2003/0013036 A1 1/2003 Lee et al.

FOREIGN PATENT DOCUMENTS

| EP | 0 440 374 A2 | 8/1991 |
| EP | 1367439 A1 * | 12/2003 |
| JP | 6-41221 A | 2/1994 |
| JP | 2000-122291 A | 4/2000 |
| JP | 3173368 B2 | 3/2001 |
| JP | 2001-114825 A | 4/2001 |
| JP | 2001-206917 A | 7/2001 |
| JP | 2002-323768 A | 11/2002 |

OTHER PUBLICATIONS

Patent Abstracts of Japan (JP-A-11-282163), Shiro Tan, "Positive Photosensitive Composition" copyrighted 1999.
European Search Report dated Feb. 1, 2006.

* cited by examiner

*Primary Examiner*—Cynthia Hamilton
(74) *Attorney, Agent, or Firm*—Sughrue Mion PLLC

(57) ABSTRACT

A positive resist composition satisfying high sensitivity, high resolution and good line edge roughness at the same time, and a pattern forming method using the resist composition are provided, which are a positive resist composition comprising (A) a resin which becomes soluble in alkali developer increases under the action of an acid, the resin having two kinds of repeating units each having a specific styrene skeleton, (B) a compound of generating an acid upon irradiation with actinic rays or radiation, and (C) an organic basic compound, and a pattern forming method using the resist composition.

17 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition suitably used in the ultramicrolithography process of producing, for example, VLSI or high-capacity microchip or in other photofabrication processes. More specifically, the present invention relates to a positive photoresist capable of forming a highly refined pattern with use of electron beam, X-ray, EUV light or the like, that is, a positive resist composition suitably usable for fine processing of a semiconductor device, where electron beam, X-ray or EUV light (wavelength: around 13 nm) is used.

2. Background Art

In the process of producing a semiconductor device such as IC and LSI, fine processing by lithography using a resist composition has been conventionally performed. Recently, the integration degree of integrated circuits is becoming higher and formation of an ultrafine pattern in the sub-micron or quarter-micron region is required. To cope with this requirement, the exposure wavelength also tends to become shorter, for example, from g line to i line or further to KrF excimer laser light. At present, development of lithography using electron beam, X ray or EUV light other than the excimer laser light is proceeding.

In particular, the electron beam lithography is positioned as a pattern forming technique of the next generation or second next generation and a high-sensitivity and high-resolution positive resist is being demanded. In the positive resist for use with electron beam, when higher elevation is sought for, not only reduction of resolution but also worsening of line edge roughness are brought about and development of a resist satisfying these properties at the same time is strongly demanded. The line edge roughness as used herein means that the edge of resist at the interface between the pattern and the substrate irregularly fluctuates in the direction perpendicular to the line direction due to the resist property and when the pattern is viewed from right above, the edge gives an uneven appearance. This unevenness is transferred in the etching step using the resist as a mask and causes deterioration of electric properties, giving rise to decrease in the yield. Particularly, in the ultrafine region of 0.25 μm or less, the improvement of line edge roughness is a very important problem to be solved. It is very important how to satisfy high resolution and good line edge roughness at the same time.

In the case of using EUV as a light source, the light is at a wavelength belonging to an extreme ultraviolet region and has a high energy and therefore, in corporation with a photochemical reaction such as negative conversion ascribable to EUV light, there arises a problem such as reduction of contrast. Accordingly, also in the lithography using X-ray or EUV light, an important problem to be solved is to satisfy high sensitivity as well as high resolution and the like at the same time. These problems are in need of solution.

As for the resist suitable for such lithography process using electron beam, X-ray or EUV light, a chemical amplification-type resist utilizing an acid catalytic reaction is mainly used from the standpoint of elevating the sensitivity and in the case of a positive resist, a chemical amplification-type resist composition mainly comprising an acid generator and a phenolic polymer which is insoluble or sparingly soluble in an alkali developer but becomes soluble in an alkali developer under the action of an acid (hereinafter simply referred to as a "phenolic acid-decomposable resin") is being effectively used.

With respect to this positive resist for use with electron beam, X-ray or EUV, some resist compositions containing a phenolic acid-decomposable resin have been heretofore known (see, for example, Patent Documents 1 to 6: JP-A-2002-323768 (the term "JP-A" as used herein means an "unexamined published Japanese patent application"), JP-A-6-41221, Japanese Patent No. 3,173,368, JP-A-2000-122291, JP-A-2001-114825, and JP-A-2001-206917, respectively).

However, it is impossible at present by any combination of these techniques to satisfy high resolution and good line edge roughness in an ultrafine region at the same time.

SUMMARY OF THE INVENTION

An object of the present invention is to solve the technical problems for enhancing performances in the fine processing of a semiconductor device, where high-energy ray, X-ray, electron beam or EUV light is used, and provide a positive resist composition satisfying high sensitivity, high resolution and good line edge roughness at the same time.

The present inventors have made intensive studies, as a result, surprisingly, it has been found that the object of the present invention can be attained by a positive composition comprising (A) a specific phenolic acid-decomposable resin, (B) a compound of generating an acid upon irradiation with actinic rays or radiation and (C) an organic basic compound.

That is, the present invention has been accomplished by the following constitutions.

(1) A positive resist composition comprising:

(A) a resin of which solubility in an alkali developer increases under the action of an acid, the resin having a repeating unit represented by formula (I) and a repeating unit represented by formula (II), (B) a compound of generating an acid upon irradiation with actinic rays or radiation, and (C) an organic basic compound:

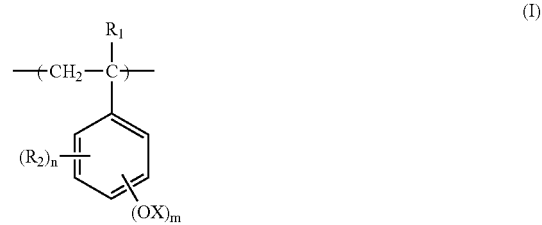

wherein $R_1$ represents a hydrogen atom, a methyl group, a cyano group, a halogen atom or a perfluoro group, $R_2$ represents a non-acid-decomposable group, X represents a hydrogen atom or an organic group, m represents an integer of 1 to 4, n represents an integer of 1 to 4, provided that 2≦n+m≦5,
p represents an integer of 1 to 4,
when m or p is an integer of 2 to 4, multiple Xs may be the same or different,
when n is an integer of 2 to 4, multiple $R_2$s may be the same or different, and
$R_1$ and X in formula (II) may be the same as or different from $R_1$ and X in formula (I), respectively.

(2) The positive resist composition as described in (1) above, wherein the repeating unit represented by formula (I) is a repeating unit represented by formula (Ia):

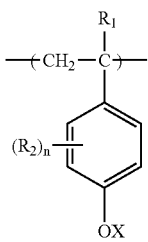

(Ia)

wherein $R_1$, $R_2$, X and n have the same meanings as in formula (I).

(3) The positive resist composition as described in (1) or (2) above, wherein the repeating unit represented by formula (I) is a repeating unit represented by formula (Ib):

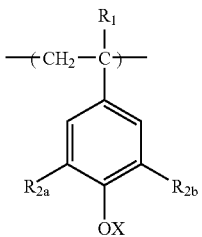

(Ib)

wherein $R_1$ and X have the same meanings as in formula (I), and $R_{2a}$ and $R_{2b}$ each independently represents a hydrogen atom or a non-acid-decomposable group, provided that at least one of $R_{2a}$ and $R_{2b}$ represents a non-acid-decomposable group.

(4) The positive resist composition as described in any one of (1) to (3) above, wherein the non-acid-decomposable group represented by $R_2$ in formula (I) contains an oxygen atom.

(5) The positive resist composition as described in any one of (1) to (4) above, wherein the non-acid-decomposable group represented by $R_2$ in formula (I) contains a halogen atom.

(6) The positive resist composition as described in any one of (1) to (5) above, wherein the repeating unit represented by formula (II) is a repeating unit represented by formula (IIa):

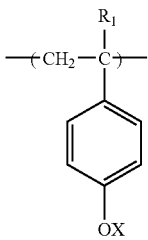

(IIa)

wherein $R_1$ and X have the same meanings as in formula (II).

(7) The positive resist composition as described in any one of (1) to (6) above, wherein the resin (A) further contains a repeating unit represented by formula (III):

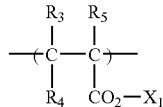

(III)

wherein $R_3$ to $R_5$ each independently represents a hydrogen atom, a fluorine atom, a chlorine atom, a cyano group or an alkyl group, and $X_1$ represents a hydrogen atom or an organic group.

(8) The positive resist composition as described in any one of (1) to (7) above, wherein at least one of X in formula (I), X in formula (II) and $X_1$ in formula (III) contains at least one of an alicyclic structure and an aromatic ring structure.

(9) The positive resist composition as described in (1) to (8) above, wherein the non-acid-decomposable group represented by $R_2$ in formula (I) is an alkoxy group.

(10) The positive resist composition as described in any one of (1) to (9) above, which further comprises (D) a surfactant.

(11) The positive resist composition as described in any one of (1) to (10) above, which comprises (B1) a compound of generating an organic sulfonic acid under the action of actinic rays or radiation as the compound (B).

(12) The positive resist composition as described in (11) above, which further comprises (B2) a compound of generating a carboxylic acid under the action of actinic rays or radiation.

(13) The positive resist composition as described in any one of (1) to (12) above, which further comprises a solvent.

(14) The positive resist composition as described in (13) above, wherein the solvent contains a propylene glycol monomethyl ether acetate.

(15) The positive resist composition as described in (14) above, wherein the solvent further contains a propylene glycol monomethyl ether.

(16) The positive resist composition as described in (1) to (15) above, which is exposed by the irradiation of electron beam, X-ray or EUV.

(17) A pattern forming method comprising forming a resist film by using the resist composition described in any one of (1) to (16) above, and exposing and developing the resist film.

The photosensitive composition of the present invention can realize sufficiently good resolution and line edge roughness particularly under irradiation of electron beam or EUV.

DETAILED DESCRIPTION OF THE INVENTION

The compounds for use in the present invention are described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) A Resin of which Solubility in an Alkali Developer Increases Under the Action of an Acid The resin of which solubility in an alkali developer increases under the action of an acid, which is used in the present invention, contains a repeating unit represented by formula (I) and a repeating unit represented by formula (II):

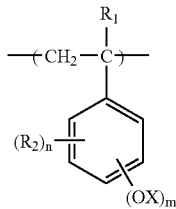

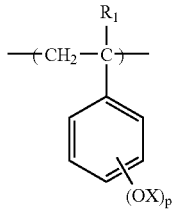

wherein $R_1$ represents a hydrogen atom, a methyl group, a cyano group, a halogen atom or a perfluoro group, $R_2$ represents a non-acid-decomposable group, X represents a hydrogen atom or an organic group, m represents an integer of 1 to 4, n represents an integer of 1 to 4, provided that $2 \leq n+m \leq 5$, p represents an integer of 1 to 4, when m or p is an integer of 2 to 4, multiple Xs may be the same or different, when n is an integer of 2 to 4, multiple $R_2$s may be the same or different, and $R_1$ and X in formula (II) may be the same as or different from $R_1$ and X in formula (I), respectively.

The perfluoro group of $R_1$ is preferably a perfluoromethyl group or a perfluoroethyl group. $R_1$ is preferably a hydrogen atom, a methyl group or a $C_mF_{2m+1}$ group (m is preferably 1), more preferably a hydrogen atom or a methyl group.

$R_2$ represents a non-acid-decomposable group. The non-acid-decomposable group means a group which is not an acid-decomposable group (a group of decomposing under the action of an acid to generate an alkali-soluble group), that is, a group which does not produce an alkali-soluble group such as hydroxyl group and carboxyl group by decomposing under the action of an acid generated from a photoacid generator or the like upon exposure.

Examples of the non-acid-decomposable group of $R_2$ include a halogen atom, an alkyl group, a cycloalkyl group, an aryl group, an alkoxy group, an acyl group, —OC(=O)Ra, —OC(=O)ORa, —C(=O)ORa, —C(=O)N(Rb)Ra, —N(Rb)C(=O)Ra, —N(Rb)C(=O)ORa, —N(Rb)SO$_2$Ra, —SRa, —SO$_2$Ra, —SO$_3$Ra and —SO$_2$N(Rb)Ra. A hydrogen atom is not included in the non-acid-decomposable group.

Ra represents an alkyl group, a cycloalkyl group or an aryl group.

Rb represents a hydrogen atom, an alkyl group, a cycloalkyl group or an aryl group.

The alkyl group of $R_2$ is, for example, an alkyl group having from 1 to 8 carbon atoms and specific preferred examples thereof include a methyl group, an ethyl group, a propyl group, an n-butyl group, a sec-butyl group, a hexyl group and an octyl group.

The cycloalkyl group of $R_2$ is, for example, a cycloalkyl group having from 3 to 15 carbon atoms and specific preferred examples thereof include a cyclopentyl group, a cyclohexyl group, a norbornyl group and an adamantyl group.

The alkoxy group of $R_2$ is, for example, an alkoxy group having from 1 to 8 carbon atoms and examples thereof include a methoxy group, an ethoxy group, a propoxy group, a butoxy group, a pentyloxy group, a hexyloxy group and a cyclohexyloxy group.

The aryl group of $R_2$ is, for example, an aryl group having from 6 to 15 carbon atoms and specific preferred examples thereof include a phenyl group, a tolyl group, a naphthyl group and an anthryl group.

The acyl group of $R_2$ is, for example, an acyl group having from 2 to 8 carbon atoms and specific preferred examples thereof include a formyl group, an acetyl group, a propanoyl group, a butanoyl group, a pivaloyl group and a benzoyl group.

These groups each may have a substituent and preferred examples of the substituent include a hydroxyl group, a carboxyl group, a halogen atom (e.g., fluorine, chlorine, bromine, iodine) and an alkoxy group (e.g., methoxy, ethoxy, propoxy, butoxy). In the case of a cyclic structure, examples of the substituent further include an alkyl group (preferably having from 1 to 8 carbon atoms).

The alkyl group, cycloalkyl group and aryl group of Ra and Rb are the same as those described for $R_2$.

The organic group of X is preferably an organic group having from 1 to 40 carbon atoms and may be an acid-decomposable group or a non-acid-decomposable group.

In the case of a non-acid-decomposable group, examples of the organic group include the same organic groups as those for the non-acid-decomposable group of $R_2$ (since this is an organic group, a halogen atom is not included).

Also, examples thereof include an alkyl group, a cycloalkyl group, an alkenyl group, an aryl group, an alkyloxy group (excluding —O-tertiary alkyl group), an acyl group, a cycloalkyloxy group, an alkenyloxy group, an aryloxy group, an alkylcarbonyloxy group, an alkylamidomethyloxy group, an alkylamide group, an arylamidomethyl group and an arylamide group.

Of these non-acid-decomposable groups, preferred are an acyl group, an alkylcarbonyloxy group, an alkyloxy group, a cycloalkyloxy group, an aryloxy group, an alkylamideoxy group and an alkylamide group, and more preferred are an acyl group, an alkylcarbonyloxy group, an alkyloxy group, a cycloalkyloxy group and an aryloxy group are.

In the non-acid-decomposable group, the alkyl group is preferably an alkyl group having from 1 to 4 carbon atoms, such as methyl group, ethyl group, propyl group, n-butyl group, sec-butyl group and tert-butyl group; the cycloalkyl group is preferably a cycloalkyl group having from 3 to 10 carbon atoms, such as cyclopropyl group, cyclobutyl group, cyclohexyl group and adamantyl group; the alkenyl group is preferably an alkenyl group having from 2 to 4 carbon atoms, such as vinyl group, propenyl group, allyl group and butenyl group; the aryl group is preferably an aryl group having from 6 to 14 carbon atoms, such as phenyl group, xylyl group, toluyl group, cumenyl group, naphthyl group and anthracenyl group; and the alkoxy group is preferably an alkoxy group having from 1 to 4 carbon atoms, such as methoxy group, ethoxy group, hydroxyethoxy group, propoxy group, hydroxypropoxy group, n-butoxy group, isobutoxy group and sec-butoxy group.

In the case of an acid-decomposable group, examples of the organic group of X include —C($R_{11a}$)($R_{12a}$)($R_{13a}$), —C($R_{14a}$)($R_{15a}$)(O$R_{16a}$) and —CO—OC($R_{11a}$)($R_{12a}$)($R_{13a}$).

$R_{11a}$ to $R_{13a}$ each independently represents an alkyl group, a cycloalkyl group, an alkenyl group, an aralkyl group or an aryl group. $R_{14a}$ and $R_{15a}$ each independently represents a hydrogen atom or an alkyl group. $R_{16a}$ represents an alkyl group, a cycloalkyl group, an alkenyl group, an aralkyl group or an aryl group. Two of $R_{11a}$, $R_{12a}$ and $R_{13a}$, or two of $R_{14a}$, $R_{15a}$ and $R_{16a}$ may combine to form a ring.

Also, into X of formula (I), a group having an acid-decomposable group may be introduced by modification. X having introduced thereinto an acid-decomposable group is, for example, represented by the following formula:

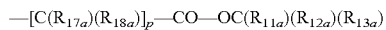
—[C($R_{17a}$)($R_{18a}$)]$_p$—CO—OC($R_{11a}$)($R_{12a}$)($R_{13a}$)

wherein $R_{17a}$ and $R_{18a}$ each independently represents a hydrogen atom or an alkyl group, and p represents an integer of 1 to 4.

The repeating unit represented by formula (I) is preferably a repeating unit represented by formula (Ia), more preferably a repeating unit represented by formula (Ib):

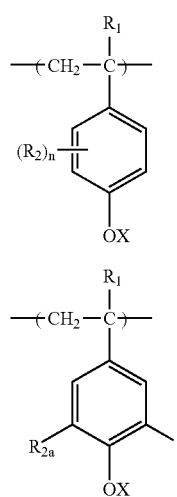

In these formulae, $R_1$, $R_2$, S and n have the same meaning as in formula (I).

In formula (Ib), $R_{2a}$ and $R_{2b}$ each is a hydrogen atom or a non-acid-decomposable group, provided that at least either one is a non-acid-decomposable group. The non-acid-decomposable group of $R_{2a}$ and $R_{2b}$ is the same as the non-acid decomposable group of $R_2$ in formula (I).

Specific examples of the repeating unit represented by formula (I) include, but are not limited to, those contained in the resins used in Examples.

The repeating unit represented by formula (II) is preferably a repeating unit represented by formula (IIa):

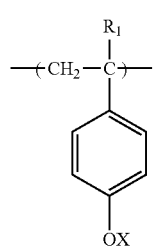

wherein $R_1$ and X have the same meanings as in formula (II).

Specific examples of the repeating unit represented by formula (II) include, but are not limited to, those set forth below.

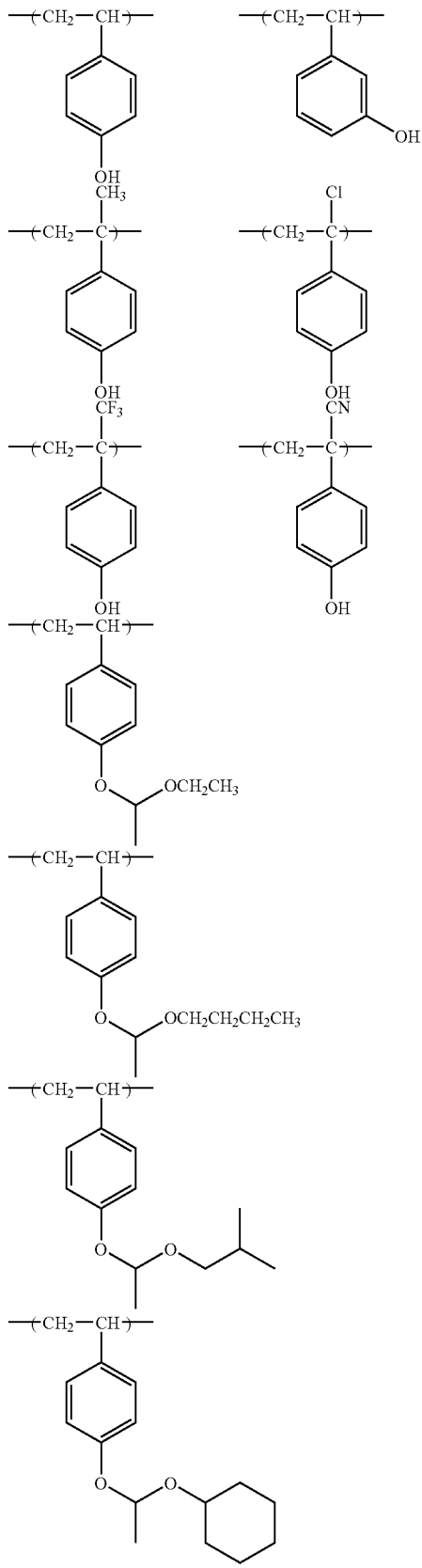

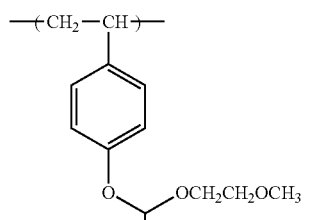
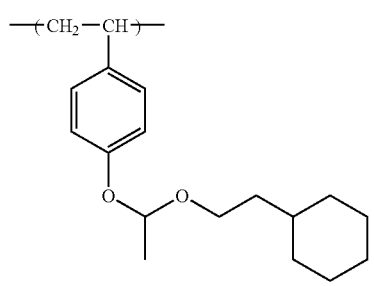
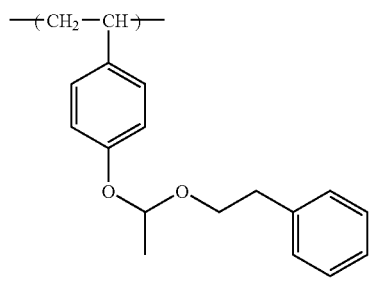
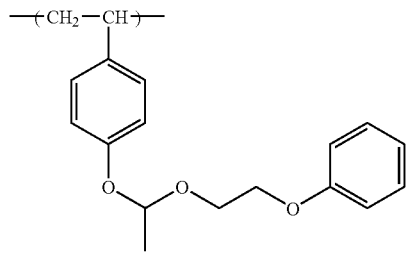
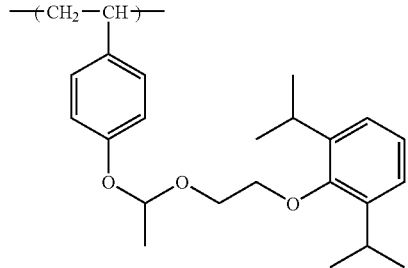
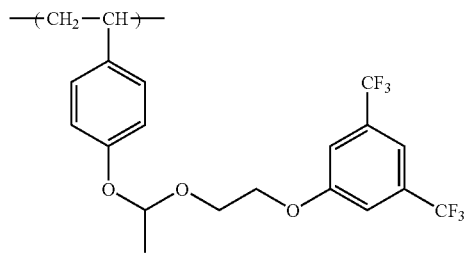
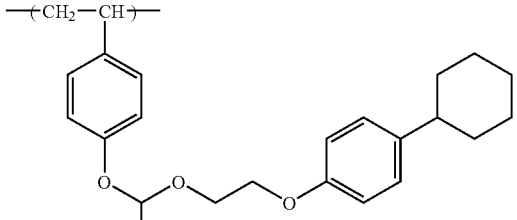
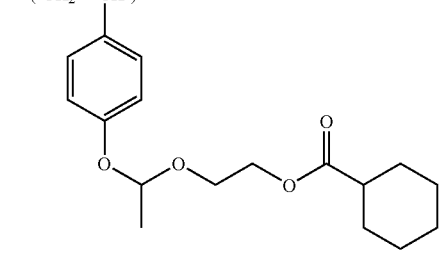
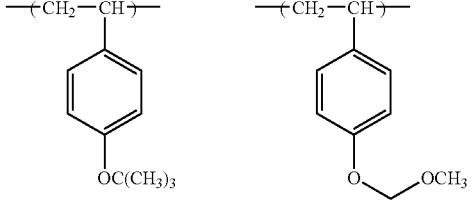
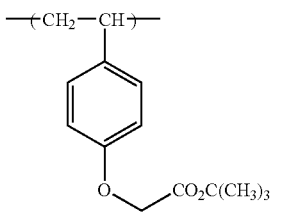
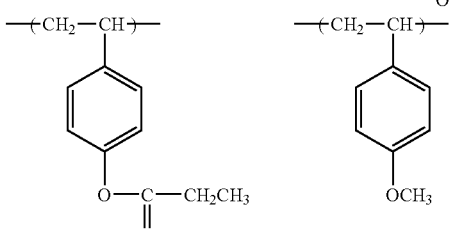
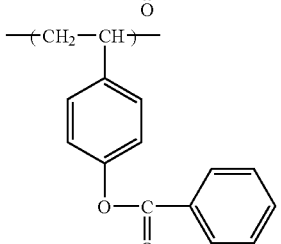
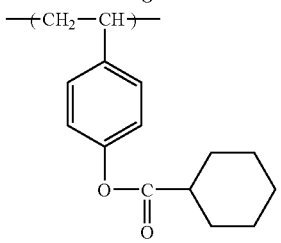

The resin (A) preferably contains a repeating unit represented by formula (III) in addition to the repeating units represented by formulae (I) and (II):

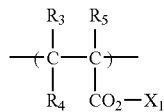
(III)

wherein $R_3$ to $R_5$ each independently represents a hydrogen atom, a fluorine atom, a chlorine atom, a cyano group or an alkyl group, and $X_1$ represents a hydrogen atom or an organic group.

The alkyl group of $R_3$ to $R_5$ is preferably an alkyl group having from 1 to 5 carbon atoms and examples thereof include a methyl group, an ethyl group and a propyl group.

The organic group of $X_1$ is preferably an organic group having from 1 to 40 carbon atoms and may be an acid-decomposable group or a non-acid-decomposable group.

In the case of a non-acid-decomposable group, examples of the organic group include the same organic groups for the non-acid-decomposable group of $R_2$ (since this is an organic group, a halogen atom is not included).

Also, examples thereof include an alkyl group, a cycloalkyl group, an alkenyl group, an aryl group, an alkyloxy group (excluding —O-tertiary alkyl group), an acyl group, a cycloalkyloxy group, an alkenyloxy group, an aryloxy group, an alkylcarbonyloxy group, an alkylamidomethyloxy group, an alkylamide group, an arylamidomethyl group and an arylamide group.

Of these non-acid-decomposable groups, preferred are an acyl group, an alkylcarbonyloxy group, an alkyloxy group, a cycloalkyloxy group, an aryloxy group, an alkylamideoxy group and an alkylamide group, and more preferred are an acyl group, an alkylcarbonyloxy group, an alkyloxy group, a cycloalkyloxy group and an aryloxy group.

In the non-acid-decomposable group, the alkyl group is preferably an alkyl group having from 1 to 4 carbon atoms, such as methyl group, ethyl group, propyl group, n-butyl group, sec-butyl group and tert-butyl group; the cycloalkyl group is preferably a cycloalkyl group having from 3 to 10 carbon atoms, such as cyclopropyl group, cyclobutyl group, cyclohexyl group and adamantyl group; the alkenyl group is preferably an alkenyl group having from 2 to 4 carbon atoms, such as vinyl group, propenyl group, allyl group and butenyl group; the aryl group is preferably an aryl group having from 6 to 14 carbon atoms, such as phenyl group, xylyl group, toluyl group, cumenyl group, naphthyl group and anthracenyl group; and the alkyloxy group is preferably an alkyloxy group having from 1 to 4 carbon atoms, such as methoxy group, ethoxy group, hydroxyethoxy group, propoxy group, hydroxypropoxy group, n-butoxy group, isobutoxy group and sec-butoxy group.

In the case of an acid-decomposable group, examples of the organic group of X include —C($R_{11a}$)($R_{12a}$)($R_{13a}$), —C($R_{14a}$)($R_{15a}$)(O$R_{16a}$) and —CO—OC($R_{11a}$)($R_{12a}$)($R_{13a}$).

$R_{11a}$ to $R_{13a}$ each independently represents an alkyl group, a cycloalkyl group, an alkenyl group, an aralkyl group or an aryl group. $R_{14a}$ and $R_{15a}$ each independently represents a hydrogen atom or an alkyl group. $R_{16a}$ represents an alkyl group, a cycloalkyl group, an alkenyl group, an aralkyl group or an aryl group. Two of $R_{11a}$, $R_{12a}$ and $R_{13a}$, or two of $R_{14a}$, $R_{15a}$ and $R_{16a}$ may combine to form a ring.

Also, a group having an acid-decomposable group may be introduced into $X_1$ by modification. $X_1$ having introduced thereinto an acid-decomposable group is, for example, represented by the following formula:

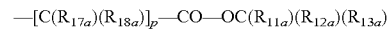

wherein $R_{17a}$ and $R_{18a}$ each independently represents a hydrogen atom or an alkyl group, and p represents an integer of 1 to 4.

The organic group of $X_1$ is preferably an acid-decomposable group having at least one cyclic structure selected from an alicyclic structure, an aromatic cyclic structure and a crosslinked alicyclic structure, and the structure is preferably a structure containing an aromatic group (particularly a phenyl group) or a structure containing an alicyclic or crosslinked alicyclic structure represented by any one of the following formulae (pI) to (pVI):

(pI)

(pII)

(pIII)

(pIV)

(pV)

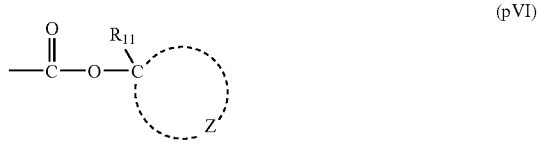
(pVI)

wherein $R_{11}$ represents a methyl group, an ethyl group, an n-propyl group, an isopropyl group, an n-butyl group, an isobutyl group or a sec-butyl group, Z represents an atomic group necessary for forming an alicyclic hydrocarbon group together with the carbon atom, $R_{12}$ to $R_{16}$ each independently represents a linear or branched alkyl group having from 1 to 4 carbon atoms or an alicyclic hydrocarbon group, provided that at least one of $R_{12}$ to $R_{14}$ or either one of $R_{15}$ and $R_{16}$ represents an alicyclic hydrocarbon group, $R_{17}$ to $R_{21}$ each independently represents a hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group, $R_{22}$ to $R_{25}$ each independently represents a hydrogen atom, a linear or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may combine with each other to form a ring.

In formulae (pI) to (pVI), the alkyl group of $R_{12}$ to $R_{25}$ is a linear or branched alkyl group having from 1 to 4 carbon atoms, which may be substituted or unsubstituted, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may further have include an alkoxy group having from 1 to 4 carbon atoms, a halogen atom (e.g., fluorine, chlorine, bromine, iodine), an acyl group, an acyloxy group, a cyano group, a hydroxyl group, a carboxy group, an alkoxycarbonyl group and a nitro group.

The alicyclic hydrocarbon group of $R_1$, to $R_{25}$ and the alicyclic hydrocarbon group formed by Z and the carbon atom each may be monocyclic or polycyclic. Specific examples thereof include a group having 5 or more carbon atoms and having a monocyclic, bicyclic, tricyclic or tetracyclic structure. The number of carbon atoms in the group is preferably from 6 to 30, more preferably from 7 to 25. These alicyclic hydrocarbon groups each may have a substituent.

Examples of the structure of the alicyclic moiety in the alicyclic hydrocarbon group are set forth below.

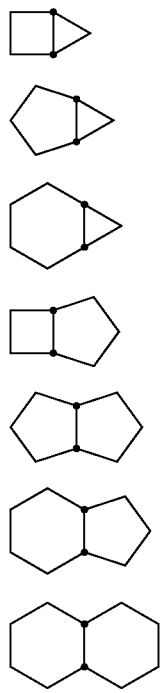

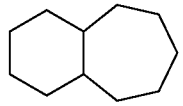

(8)

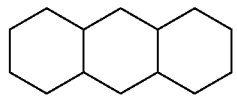

(9)

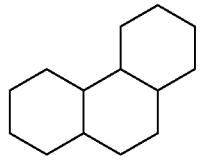

(10)

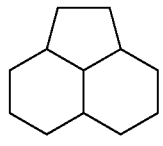

(11)

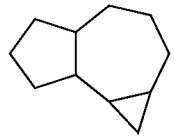

(12)

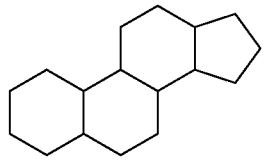

(13)

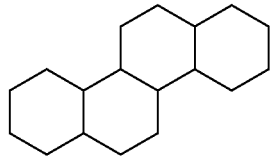

(14)

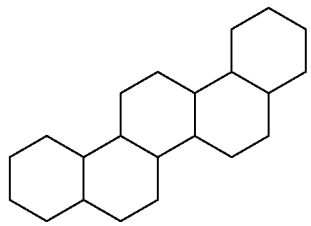

(15)

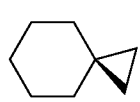

(16)

(17)

(18)

-continued
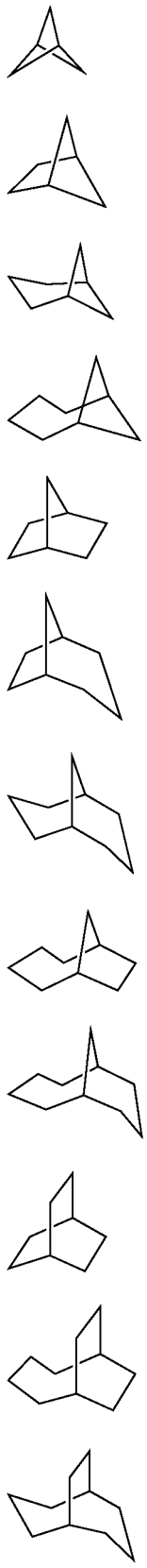
-continued
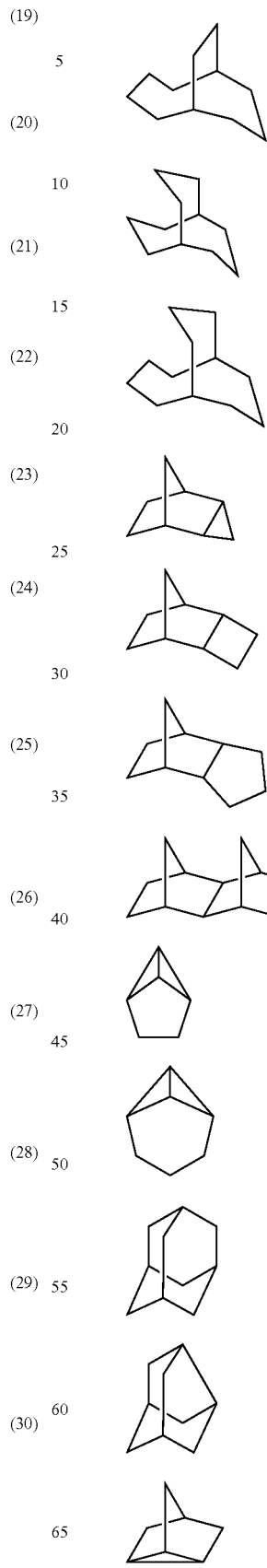

-continued

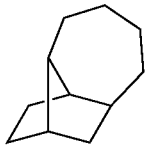
(43)

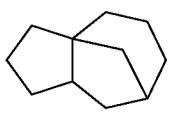
(44)

(45)

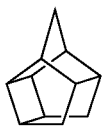
(46)

(47)

(48)

(49)

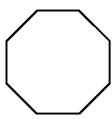
(50)

Among these alicyclic moieties, preferred in the present invention are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alicyclic hydrocarbon group may have include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a substituent selected from the group consisting of a methyl group, an ethyl group, a propyl group and an isopropyl group. The alkoxy group includes an alkoxy group having from 1 to 4 carbon atoms, such as methoxy group, ethoxy group, propoxy group and butoxy group.

The alkyl group, alkoxy group and alkoxycarbonyl group each may further have a substituent and examples of the substituent include an alkoxy group having from 1 to 4 carbon atoms (e.g., methoxy, ethoxy, butoxy), a hydroxy group, an oxo group, an alkylcarbonyl group (preferably having from 2 to 5 carbon atoms), an alkylcarbonyloxy group (preferably having from 2 to 5 carbon atoms), an alkyloxycarbonyl group (preferably having 2 to 5 carbon atoms) and a halogen atom (e.g., chlorine, bromine, fluorine).

In the resin (A), for maintaining good developability in an alkali developer, another appropriate polymerizable monomer may be copolymerized so that an alkali-soluble group such as phenolic hydroxyl group, carboxyl group, sulfonic acid group and hexafluoroisopropanol group ($-C(CF_3)_2OH$) can be introduced, or for enhancing the film property, another hydrophobic polymerizable monomer such as alkyl acrylate and alkyl methacrylate may be copolymerized.

The content of the repeating unit represented by formula (I) is preferably from 3 to 95 mol %, more preferably from 5 to 90 mol %, still more preferably from 10 to 85 mol %, based on all repeating units constituting the resin.

The content of the repeating unit represented by formula (II) is preferably from 1 to 90 mol %, more preferably from 3 to 80 mol %, still more preferably from 5 to 70 mol %, based on all repeating units constituting the resin.

The content of the repeating unit represented by formula (III) is preferably from 1 to 90 mol %, more preferably from 3 to 80 mol %, still more preferably from 5 to 70 mol %, based on all repeating units constituting the resin.

The content of the repeating unit having an alkali-soluble group such as hydroxyl group, carboxy group and sulfonic acid group is preferably from 1 to 99 mol %, more preferably from 3 to 95 mol %, still more preferably from 5 to 90 mol %, based on all repeating units constituting the resin.

The content of the repeating unit having an acid-decomposable group is preferably from 3 to 95 mol %, more preferably from 5 to 90 mol %, still more preferably from 10 to 85 mol %, based on all repeating units constituting the resin.

The resin can be synthesized by a known synthesis method such as a method of reacting an alkali-soluble resin with a precursor of a group capable of decomposing under the action of an acid, described in European Patent 254,853, JP-A-2-258500, JP-A-3-223860 and JP-A-251259, or a method of copolymerizing a monomer having a group capable of decomposing under the action of an acid with various monomers.

The weight average molecular weight (Mw) of the resin is preferably from 1,000 to 200,000, more preferably from 1,500 to 100,000, still more preferably from 2,000 to 50,000. If the weight average molecular weight is less than 1,000, there may arise a problem in the film loss of unexposed area, and therefore, the weight average molecular weight is preferably 1,000 or more. Also, in view of dissolution rate of the resin itself in an alkali as well as sensitivity, the weight average molecular weight is preferably 200,000 or less. The molecular weight dispersity (Mw/Mn) is preferably from 1.0 to 3.0, more preferably from 1.0 to 2.0, still more preferably from 1.0 to 1.6.

The weight average molecular weight as used herein is defined by the polystyrene-reduced value according to gel permeation chromatography.

The resins (A) may be used in combination of two or more thereof

The amount in total of the resin (A) added is usually from 30 to 99 mass %, preferably from 40 to 97 mass %, more preferably from 50 to 95 mass %, based on the solid content of the positive resist.

Specific examples of the resin include, but are not limited to, those described in Examples.

[2] (B) A Compound of Generating an Acid upon Irradiation with Actinic Rays or Radiation The compound of generating an acid upon irradiation with actinic rays or radiation, such as X-ray, electron beam, ion beam and EUV, which is used in the positive resist composition of the present invention, is described below (hereinafter, this compound is sometimes referred to as an "acid generator").

As for the acid generator usable in the present invention, a photoinitiator for photocationic polymerization, a photoinitiator for photoradical polymerization, a photo-decoloring agent for dyes, a photo-discoloring agent, a known compound of generating an acid upon irradiation with actinic rays or radiation, which is used for microresist or the like, or a mixture thereof may be appropriately selected and used.

Examples thereof include onium salts such as diazonium salt, ammonium salt, phosphonium salt, iodonium salt, sulfonium salt, selenonium salt and arsonium salt, organic halogen compounds, organic metals/organic halides, photo-acid generators having an o-nitrobenzyl-type protective group, compounds of undergoing photolysis to generate a sulfonic acid, as represented by iminosulfonate, and disulfone compounds.

Also, compounds in which a group or compound of generating an acid upon irradiation with actinic rays or radiation is introduced into the main or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds of generating an acid under irradiation with light described, for example, in U.S. Pat. No. 3,779,778 and European Patent 126,712 may also be used.

Among these usable compounds of decomposing upon irradiation with actinic rays or radiation to generate an acid, particularly effective compounds are described below.

(1) Iodonium salt represented by the following formula (PAG1) and sulfonium salt represented by formula (PAG2):

Ar$^1$ and Ar$^2$ each independently represents an aryl group. Preferred examples of the substituent for the aryl group include an alkyl group, a cycloalkyl group, an aryl group, an alkoxy group, a nitro group, a carboxyl group, an alkoxycarbonyl group, a hydroxy group, a mercapto group and a halogen atom.

R$^{201}$, R$^{202}$ and R$^{203}$ each independently represents an alkyl group or an aryl group, preferably an aryl group having from 6 to 14 carbon atoms, an alkyl group having from 1 to 8 carbon atoms, or a substitution derivative thereof.

Preferred examples of the substituent for the aryl group include an alkoxy group having from 1 to 8 carbon atoms, an alkyl group having from 1 to 8 carbon atoms, a nitro group, a carboxyl group, a hydroxy group, a halogen atom, —SO$_2$Ra, —SO$_3$Ra, —OSO$_2$Ra, —OSO$_2$Ra, —SO$_2$N(Rb)Ra and —N(Rb)SO$_2$Ra (wherein Ra and Rb each has the same definition as Ra and Rb in the formula (I)), and preferred examples of the substituent for the alkyl group include an alkoxy group having from 1 to 8 carbon atoms, a carboxyl group and an alkoxycarbonyl group.

Z$^-$ represents a non-nucleophilic anion and examples thereof include, but are not limited to, BF$_4^-$, AsF$_6^-$, PF$_6^-$, SbF$_6^-$, SiF$_6^{2-}$, ClO$_4^-$, perfluoroalkanesulfonate anion (e.g., CF$_3$SO$_3^-$), pentafluorobenzenesulfonate anion, substituted benzenesulfonate anion, condensed polynuclear aromatic sulfonate anion (e.g., naphthalene-1-sulfonate anion), anthraquinonesulfonate anion, sulfonic acid group-containing dyes, perfluoroalkylcarboxylate anion, alkylcarboxylate anion and benzoate anion.

Two of R$^{201}$, R$^{202}$ and R$^{203}$, or Ar$^1$ and Ar$^2$ may be combined through a single bond or a substituent.

Specific examples of these onium salts include, but are not limited to, the following compounds:

diphenyliodonium dodecylbenzenesulfonate, diphenyliodonium trifluoromethanesulfonate, bis(4-trifluoromethylphenyl)iodonium trifluoromethanesulfonate, bis(4-tert-butylphenyl)iodonium camphorsulfonate, triphenylsulfonium dodecylbenzenesulfonate, triphenylsulfonium-2,4,6-trimethylbenzenesulfonate, triphenylsulfonium-2,4,6-triisopropylbenzenesulfonate, triphenylsulfonium trifluoromethanesulfonate, triphenylsulfonium perfluorooctanesulfonate, triphenylsulfonium perfluorononanesulfonate, triphenylsulfonium camphorsulfonate, triphenylsulfonium perfluorobenzenesulfonate and triphenylsulfonium-3,4-bis(trifluoromethyl)benzenesulfonate.

The onium salts represented by formulae (PAG1) and (PAG2) are known and can be synthesized by the method described, for example, in U.S. Pat. Nos. 2,807,648 and 4,247,473 and JP-A-53-101331.

Specific examples of the acid generators represented by formulae (PAG1) and (PAG2) other than those described above are set forth below.

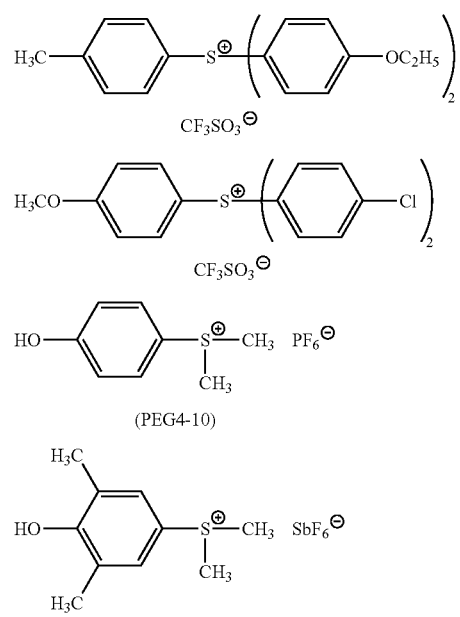

(PEG4-10)

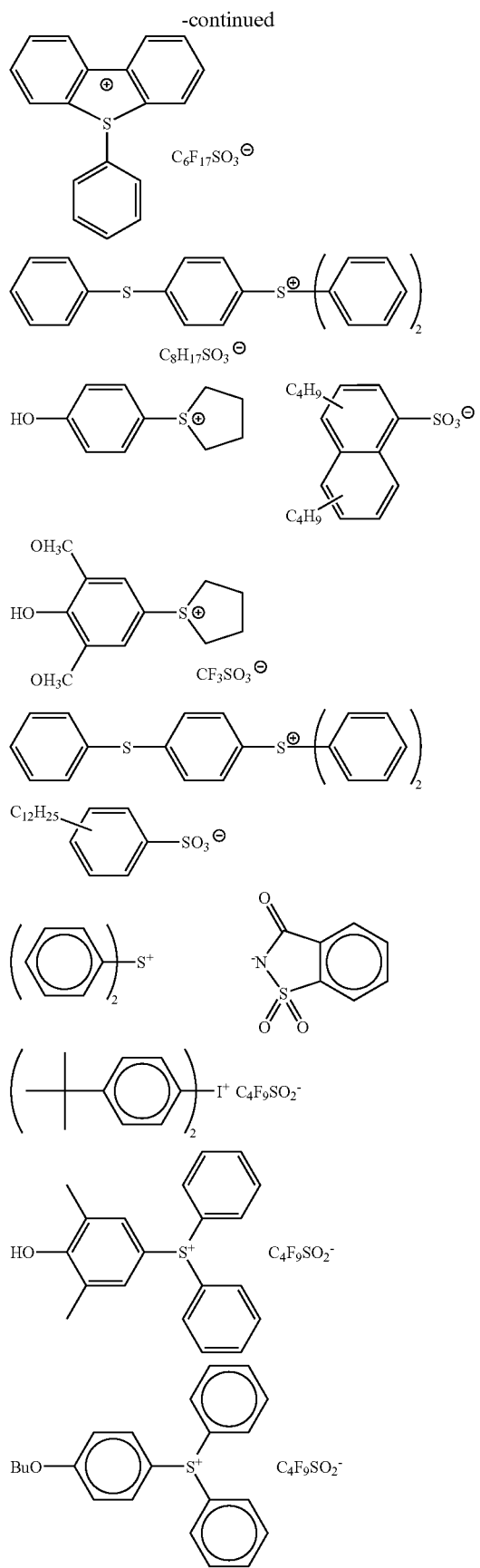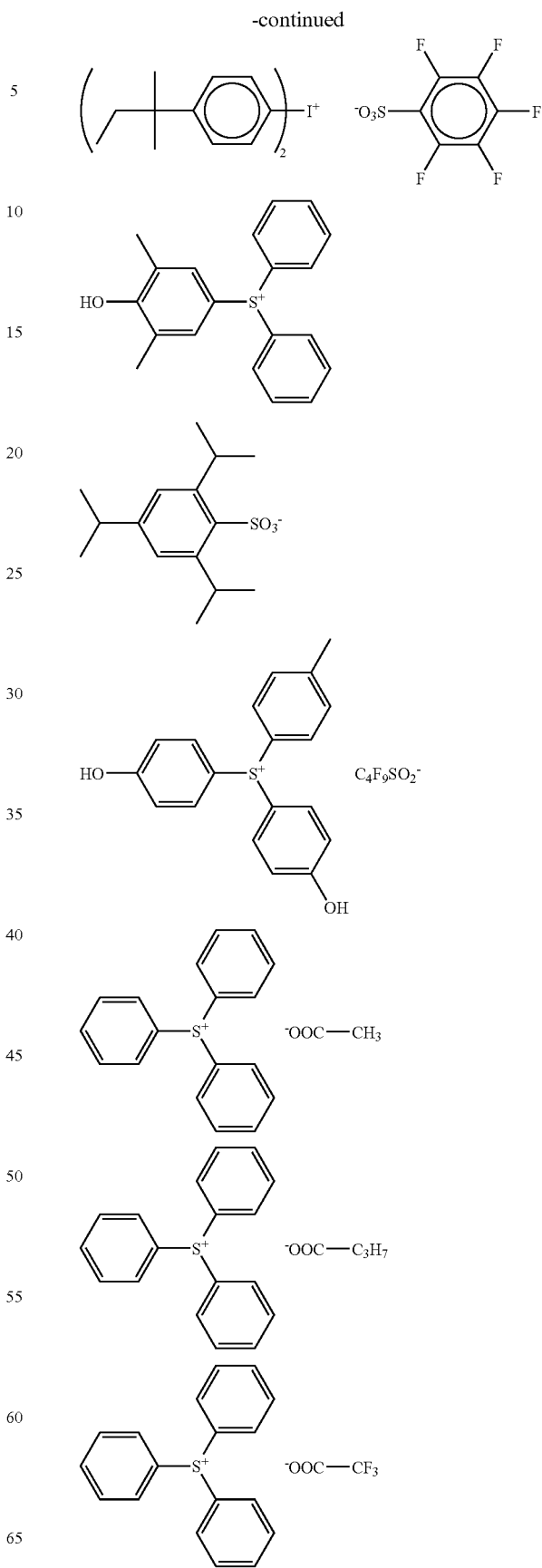

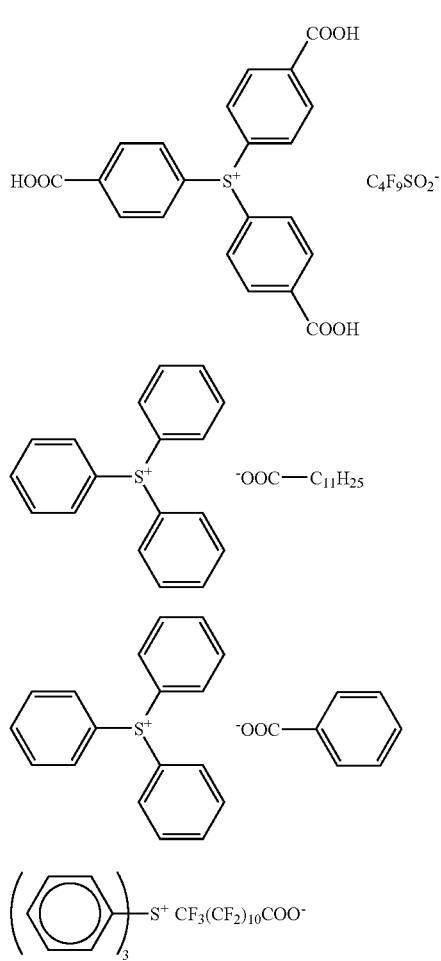

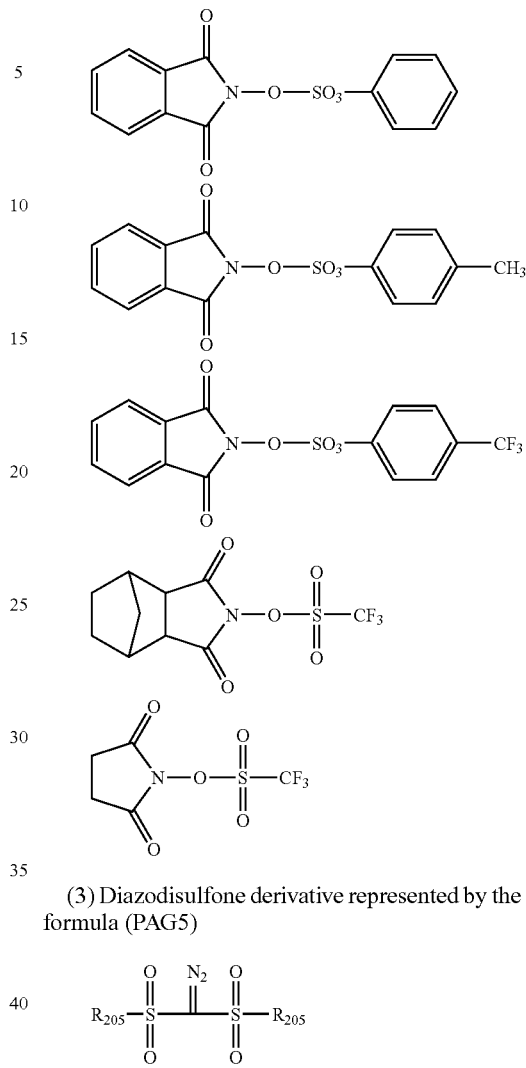

(2) Disulfone derivative represented by the following formula (PAG3) and iminosulfonate derivative represented by formula (PAG4):

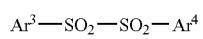 (PAG3)

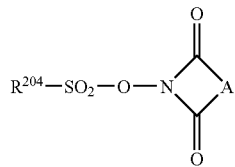 (PAG4)

$Ar^3$ and $Ar^4$ each independently represents an aryl group.

$R^{204}$ represents an alkyl group or an aryl group, and A represents an alkylene group, an alkenylene group or an arylene group.

Specific examples thereof include, but are not limited to, the following compounds:

bis(tolyl)disulfone, bis(4-methoxyphenyl)disulfone, bis(4-trifluoromethylphenyl)disulfone, phenyl-4-isopropylphenyldisulfone, (3) Diazodisulfone derivative represented by the following formula (PAG5)

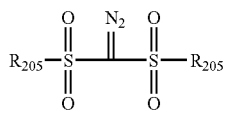 (PAG5)

wherein each $R_{205}$ independently represents an alkyl group, a cycloalkyl group or an aryl group.

Specific examples thereof include, but are not limited to, the following compounds:

bis(phenylsulfonyl)diazomethane, bis(2,4-dimethyl-phenylsulfonyl)diazomethane, bis(cyclohexylsulfonyl)diazomethane, bis(tolylsulfonyl)diazomethane and bis(tert-butylsulfonyl)diazomethane.

(4) Also, a phenacylsulfonium derivative represented by the following formula (PAG6) may also be used as the acid generator.

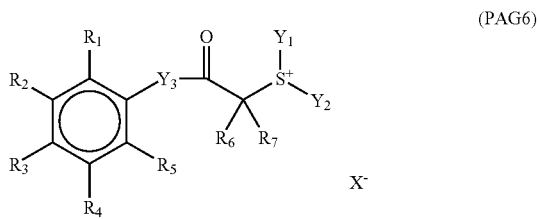 (PAG6)

wherein $R_1$ to $R_5$ each independently represents a hydrogen atom, an alkyl group, a cycloalkyl group, an alkoxy group, a nitro group, a halogen atom, an alkyloxycarbonyl group or an aryl group, at least two or more of $R_1$ to $R_5$ may combine to form a ring structure, $R_6$ and $R_7$ each independently represents a hydrogen atom, an alkyl group, a cycloalkyl group, a cyano group or an aryl group, $Y_1$ and $Y_2$ each represents an alkyl group, a cycloalkyl group, an aryl group, an aralkyl group or an aromatic group containing a heteroatom, $Y_1$ and $Y_2$ may combine to form a ring, $Y_3$ represents a single bond or a divalent linking group, $X^-$ has the same meaning as $Z^-$ in (PAG1), and at least one of $R_1$ to $R_5$ and at least one of $Y_1$ and $Y_2$ may combine to form a ring, or at least one of $R_1$ to $R_5$ and at least one of $R_6$ and $R_7$ may combine to form a ring.

The compound may have two or more structures of (PAG6) by combining these structures at any position of $R_1$ to $R_7$ or at either $Y_1$ or $Y_2$, through a linking group.

Specific examples of the compound represented by (PAG6) are set forth below, but the present invention is not limited thereto.

(I-1)
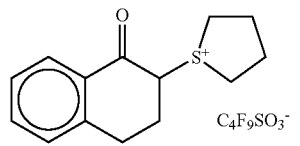

(I-2)
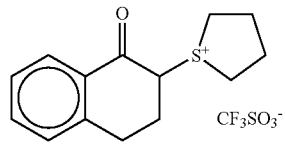

(I-3)
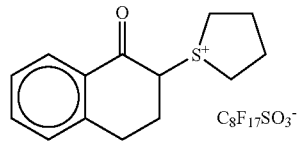

(I-4)
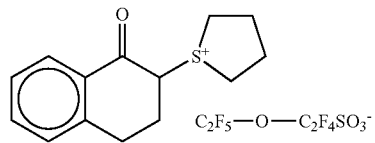

(I-5)
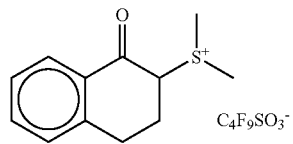

(I-6)
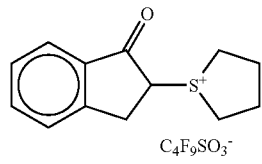

-continued (I-7)
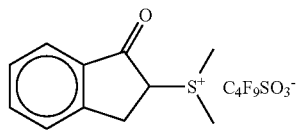

(I-8)
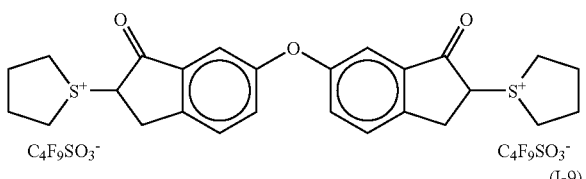

(I-9)
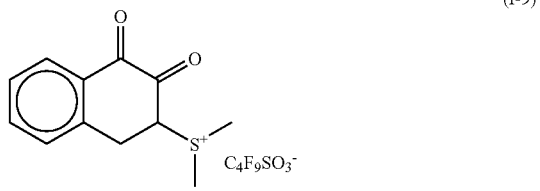

(I-10)
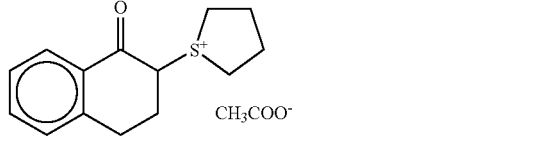

(I-11)
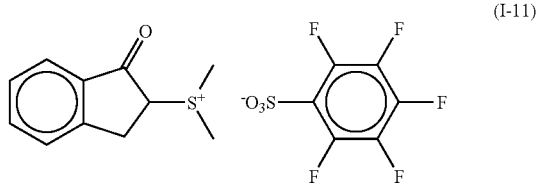

(I-12)
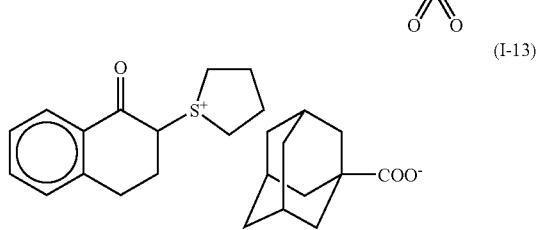

(I-13)
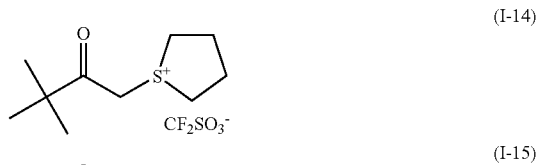

(I-14)
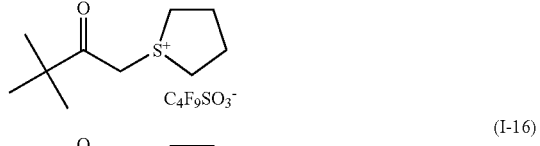

(I-15)
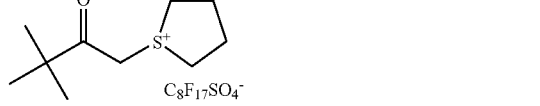

(I-16)

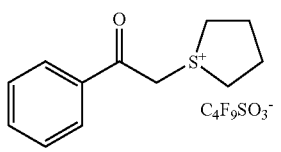
(I-17)
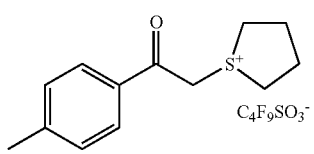
(I-18)
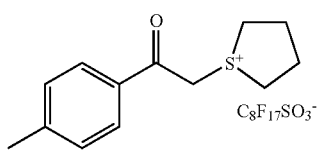
(I-19)
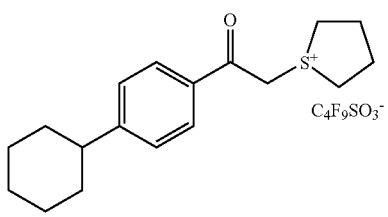
(I-20)
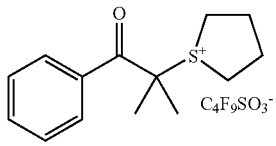
(I-21)
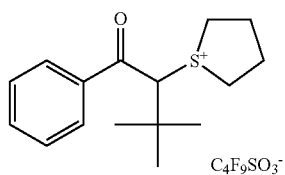
(I-22)
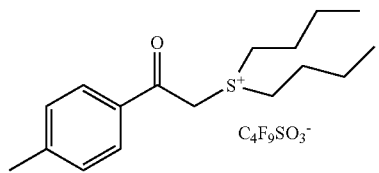
(I-23)
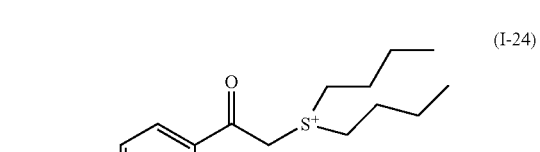
(I-24)
(I-25)
Other examples of the acid generator are set forth below.
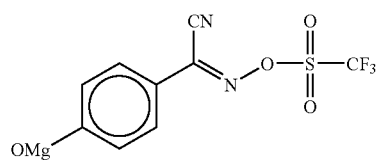
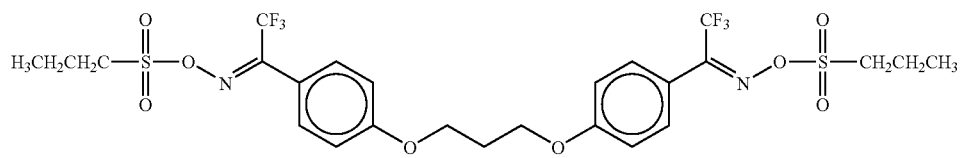

Among these acid generators, preferred are the compounds represented by formulae (PAG1), (PAG2) and (PAG4), and more preferred are the compounds represented by formulae (PAG1) and (PAG2).

The acid generator is preferably a compound of generating an organic sulfonic acid upon irradiation with actinic rays or radiation [hereinafter, this compound is sometimes referred to as a "component (B1)"]. Examples of the component (B1) include those where the counter anion $Z^-$ or $X^-$ in formulae (PAG1), (PAG2) and (PAG6) is a sulfonate anion.

In addition to the compound (B1), a compound of generating a carboxylic acid upon irradiation with actinic rays or radiation [hereinafter, this compound is sometimes referred to as a "component (B2)"] is preferably further contained as the component (B). By using the components (B1) and (B2) in combination, various performances such as sensitivity and resolution can be enhanced. Examples of the component (B2) include those where the counter anion $Z^-$ or $X^-$ in formulae (PAG1), (PAG2) and (PAG6) is a carboxylate anion.

The mass ratio of component (B1)/component (B2) is usually from 1/1 to 100/1, preferably from 1/1 to 10/1.

One of the compounds for the component (B1) or (B2) may be used alone or two or more thereof may be used in combination.

The amount added of the compound of decomposing upon irradiation with actinic rays or radiation to generate an acid is, as a total amount, usually from 0.001 to 40 mass %, preferably from 0.01 to 20 mass %, more preferably from 0.1 to 10 mass %, based on the solid content in the composition. The amount added of the compound of decomposing upon irradiation with actinic rays or radiation to generate an acid is preferably 0.001 mass % or more in view of sensitivity and preferably 40 mass % or less in view of film shape and profile.

[3] Organic Basic Compound (C)

The organic basic compound contained in the resist composition of the present invention is preferably a compound having a basicity stronger than phenol. The molecular weight of the organic basic compound is usually from 100 to 900, preferably from 150 to 800, more preferably from 200 to 700. In particular, a nitrogen-containing basic compound is preferred.

As for the preferred chemical environment of the nitrogen-containing basic compound, a compound having a structure represented by any one of the following formulae (A) to (E) is preferred. The structures of formulae (B) to (E) each may form a part of a ring structure.

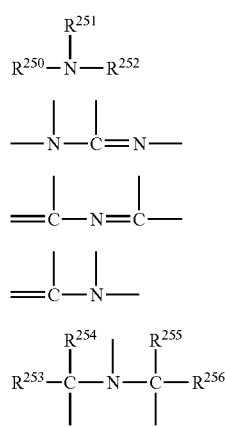

In these formulae, $R^{250}$, $R^{251}$ and $R^{252}$, which may be the same or different, each represents a hydrogen atom, an alkyl group having from 1 to 20 carbon atoms, a cycloalkyl group having from 1 to 20 carbon atoms or a substituted or unsubstituted aryl group having from 6 to 20 carbon atoms, and $R^{251}$ and $R^{252}$ may combine with each other to form a ring.

The alkyl group may or may not have a substituent. The alkyl group having a substituent is preferably an aminoalkyl group having from 1 to 6 carbon atoms or a hydroxyalkyl group having from 1 to 6 carbon atoms.

$R^{253}$, $R^{254}$, $R^{255}$ and $R^{256}$, which may be the same or different, each represents an alkyl group having from 1 to 6 carbon atoms.

The compound is more preferably a nitrogen-containing basic compound having two or more nitrogen atoms differing in the chemical environment within one molecule, still more preferably a compound containing both a substituted or unsubstituted amino group and a ring structure containing a nitrogen atom, or a compound containing an alkylamino group.

Specific preferred examples thereof include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. These compounds each may have a substituent and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

A tetraalkylammonium salt-type nitrogen-containing basic compound can also be used. In particular, a tetraalkylammonium hydroxide having from 1 to 8 carbon atoms, such as tetramethylammonium hydroxide, tetraethylammonium hydroxide, tetra-(n-butyl)animonium hydroxide, is preferred. These nitrogen-containing basic compounds are used individually or in combination of two or more thereof The ratio of the acid generator and the organic basic compound used in the composition is preferably acid generator/organic basic compound (by mol)=2.5 to 300. That is, the molar ratio is preferably 2.5 or more in view of sensitivity and resolution and preferably 300 or less from the standpoint of preventing the resolution from decreasing due to thickening of the resist pattern in aging after exposure until heat treatment. The ratio of acid generator/organic basic compound (by mol) is more preferably from 5.0 to 200, still more preferably from 7.0 to 150.

[4] Surfactants

In the present invention, surfactants can be used and use thereof is preferred in view of film-forming property, adhesion of pattern, reduction in development defects, and the like.

Specific examples of the surfactant include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); fluorine-containing or silicon-containing surfactants such as EFtop EF301, EF303, EF352 (produced by Shin Akita Chemical Co., Ltd.), Megafac F171, F173 (produced by Dainippon Ink & Chemicals, Inc.), Florad FC430, FC431 (produced by Sumitomo 3M Inc.), Asahiguard AG710, Surflon S-382, SC101, SC102, SC103, SC104, SC105 and SC106 (produced by Asahi Glass Co., Ltd.) and Troysol S-366 (produced by Troy Chemical Industries, Inc.); organosiloxane polymer KP-341 (produced by Shin-Etsu Chemical Co., Ltd.); and acrylic acid-based or methacrylic acid-based (co)polymer Polyflow No. 75 and No. 95 (produced by Kyoeisha Yushi Kagaku Kogyo). The amount of the surfactant blended is usually 2 parts by mass or less, preferably 1 part by mass or less, per 100 parts by mass of the solid content in the composition of the present invention.

These surfactants may be used individually or some of these may be added in combination.

As for the surfactant, the composition preferably contains any one of fluorine- and/or silicon-containing surfactants (a fluorine-containing surfactant, a silicon-containing surfactant or a surfactant containing both a fluorine atom and a silicon atom), or two or more thereof Examples of such surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as-is.

Examples of the commercially available surfactant which can be used include fluorine-containing or silicon-containing surfactants such as EFtop EF301 and EF303 (produced by Shin-Akita Chemical Co., Ltd.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical Industries, Inc.). In addition, polysiloxane polymer KP-341 (produced by Shin-Etsu Chemical Co., Ltd.) may also be used as a silicon-containing surfactant.

Other than those known surfactants, surfactants using a polymer having a fluoro-aliphatic group which is derived from a fluoro-aliphatic compound produced by a telomerization process (also called a telomer process) or an oligomerization process (also called an oligomer process) may be used. The fluoro-aliphatic compound can be synthesized by the method described in JP-A-2002-90991.

The polymer having a fluoro-aliphatic group is preferably a copolymer of a fluoro-aliphatic group-containing monomer with (poly(oxyalkylene))acrylate and/or (poly(oxyalkylene)) methacrylate, and the polymer may have an irregular distribution or may be block-copolymerized. Examples of the poly (oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) may be not only a binary copolymer but also a ternary or higher copolymer obtained by simultaneously copolymerizing two or more different fluoro-aliphatic group-containing monomers or two or more different (poly(oxyalkylene))acrylates (or methacrylates).

Examples thereof include commercially available surfactants such as Megafac F178, F-470, F-473, F-475, F-476 and F-472 (produced by Dainippon Ink & Chemicals, Inc.), copolymers of an acrylate (or methacrylate) having $C_6F_{13}$ group and a (poly(oxyalkylene)) acrylate (or methacrylate), copolymers of an acrylate (or methacrylate) having $C_6F_{13}$ group, a (poly(oxyethylene))acrylate (or methacrylate) and a (poly(oxypropylene)) acrylate (or methacrylate), copolymers of an acrylate (or methacrylate) having $C_8F_{17}$ group and a (poly(oxyalkylene))acrylate (or methacrylate), and copolymers of an acrylate (or methacrylate) having $C_8F_{17}$ group, a (poly(oxyethylene))acrylate (or methacrylate) and a (poly (oxypropylene))acrylate (or methacrylate).

The amount of the surfactant used is preferably from 0.0001 to 2 mass %, more preferably from 0.001 to 1 mass %, based on the entire amount of the positive resist composition (excluding solvent).

[5] Other Components

The positive resist composition of the present invention may further contain, if desired, a dye, a photo-base generator and the like.

1. Dye

In the present invention, a dye can be used.

Suitable dyes include an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

2. Photo-Base Generator

Examples of the photo-base generator which can be added to the composition of the present invention include the compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photo-base generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. The photo-base generator is added for the purpose of improving the resist profile or the like.

3. Solvents

The resist composition of the present invention is dissolved in a solvent capable of dissolving respective components described above and then coated on a support. Usually, the concentration is, in terms of the solid content concentration of all resist components, preferably from 2 to 30 mass %, more preferably from 3 to 25 mass %.

Preferred examples of the dissolution medium used here include ethylene dichloride, cyclohexanone, cyclopentanone, 2-heptanone, y-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These dissolution mediums are used individually or in combination of two or more thereof. As for the solvent, those containing a propylene glycol monomethyl ether acetate are preferred, and those containing a propylene glycol monomethyl ether are more preferred.

4. Amphoteric Ion Compound

The photosensitive resin composition of the present invention preferably further contains an amphoteric ion compound. The amphoteric ion compound as used herein indicates a compound containing both a cation moiety and an anion moiety within one molecule. Specific examples thereof include, but are not limited to, amphoteric ions of amino acid, such as alanine, phenylalanine, asparagine, glycine and valine.

The amount of the amphoteric ion compound added is preferably from 3 to 70 mol %, more preferably from 5 to 50 mol %, still more preferably from 7 to 40 mol %, based on the component (B1). By adding the component (Y), the sensitivity and contrast are more enhanced.

In the resist composition of the present invention, the generation of particle (particulate aggregate) ascribable to fluctuation of sensitivity is preferably reduced as much as possible. Generally, as the metal content is larger, the number of particles increases because the resin aggregates in the solution by using the metal as the core. Accordingly, in the composition of the present invention, the content of metal component such as Na, K, Ca, Fe and Mg contained in the resin as the component (A) is preferably small. More specifically, the content of each metal species contained in the resin is preferably 300 ppb or less, more preferably 200 ppb or less, still more preferably 100 ppb or less.

In the case where the metal impurity content in the resin is large, the number of particles readily increases, because the resin aggregates in the solvent by using the metal, impurity as the core along the change in aging. The aggregation of resin also brings about substantial change in the components constituting the resist composition and this is presumed to cause change in the sensitivity.

Examples of the metal impurity contained in the resist composition include Na, K. Ca, Fe, Mg, Mn, Pd, Ni, Zn, Pt, Ag and Cu.

As for the method of decreasing the content of metal impurities contained in the resist composition, that is, decreasing the number of particles, for example, a method of dissolving the resin in a solvent to prepare a solution and filtering the solution through an ion exchange filter, and also cleaning by liquid separation and treatment with acidic ion exchange resin or chelate resin are known.

The method for decreasing the metal impurity content in the chemical amplification-type resist composition of the present invention is preferably a method comprising a step of filtering a solution containing the resin of the present invention through an ion exchange filter, a step of adding a photoacid generator and, if desired, an organic basic compound, a surfactant and the like to the solution to prepare a mixed solution, and a step of filtering the mixed solution through an insoluble colloid removing filter.

The ion exchange filter which can be used is preferably a cation exchange filter with the ion exchange group being fixed to a polyethylene-made porous membrane or a polypropylene-made porous membrane, and examples thereof include Ion Clean (produced by Nihon Pall Ltd.) and Ion Clean AQ (produced by Nihon Pall Ltd.). The filtration rate through the ion exchange filter is preferably from 500 to 10,000 ml/min/m$^2$. The insoluble colloid removing filter is preferably a synthetic resin-made filter and examples thereof include Mykrolis Optimizer DEV-16/40 (polyethylene filter, produced by Mykrolis Corp.), Microguard Minichem (polyethylene filter, produced by Mykrolis Corp.), Enflon (polytetrafluoroethylene filter, produced by Nihon Pall Ltd.), Ultipore N66 (nylon 66 filter, produced by Nihon Pall Ltd.), Zeta Plus (cellulose filter, produced by Cuno) and Electropor II (nylon 66 filter, produced by Cuno). Also, in the case of performing the filtration step after adding an ionic compound such as photoacid generator, the insoluble colloid removing filter is preferably a filter not having ion exchanging ability. The ion exchange-type filter and the insoluble colloid removing filter each preferably has a pore size of 0.01 to 0.5 µm, more preferably from 0.01 to 0.1 µm.

The resist composition of the present invention is coated on a substrate to form a thin film. The thickness of this resist film is preferably from 0.05 to 4.0 µm.

In the present invention, a commercially available inorganic or organic antireflection film may be used, if desired. Furthermore, an antireflection film may be used by coating it as a lower layer of the resist.

The antireflection film used as the lower layer of the resist may be either an inorganic film such as titanium, titanium dioxide, titanium nitride, chromium oxide, carbon and amorphous silicon, or an organic film comprising a light absorbent and a polymer material. The former requires equipment for the film formation, such as vacuum deposition apparatus, CVD apparatus and sputtering apparatus. Examples of the organic antireflection film include a film comprising a diphenylamine derivative and formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film comprising a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV-30 Series, DUV-40 Series (produced by Brewer Science, Inc.), AR-2, AR-3 and AR-5 (produced by Shipley Co., Ltd.).

In the production or the like of a precision integrated circuit device, the step of forming a pattern on a resist film is performed by coating the positive resist composition of the present invention on a substrate (for example, silicon/silicon dioxide-coated substrate, glass substrate, ITO substrate or quartz/chromium oxide-coated substrate), drying it to form a resist film, irradiating X-ray, electron beam, ion beam or EUV thereon, preferably heating it, and then subjecting the resist film to development, rinsing and drying, whereby a good resist pattern can be formed.

The alkali developer which can be used for the resist composition of the present invention is an aqueous solution of an alkali (usually, 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetyl-ethanolamine, triethanolamine), quaternary ammonium salts (e.g., tetramethylammonium hydroxide, tetraethylammonium hydroxide, choline) and cyclic amines (e.g., pyrrole, piperidine). In this aqueous solution of an alkali, an alcohol such as isopropyl alcohol and a surfactant such as nonionic surfactant may be added each in an appropriate amount.

Among these developers, preferred are quaternary ammonium salts, more preferred are tetramethylammonium hydroxide and choline.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto.

Synthesis Example 1

Synthesis of Polymer 1a

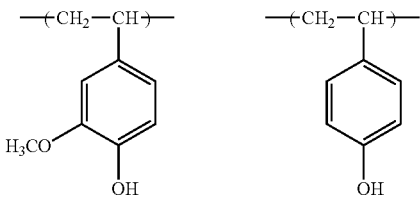

In a reaction vessel, 96.1 g (0.5 mol) of 3-methoxy-4-acetoxystyrene (produced by Honshu Chemical Industry Co., Ltd.) and 81.1 g (0.5 mol) of 4-acetoxystyrene (produced by Honshu Chemical Industry Co., Ltd.) were dissolved in 400 ml of tetrahydrofuran. While stirring the resulting solution, a nitrogen gas was passed into the system. Subsequently, 23.0 g (0.1 mol) of polymerization initiator V-601 (produced by Wako Pure Chemical Industries, Ltd.) was added thereto and the reaction solution was heated at 65° C. After stirring under heat for 10 hours, the reaction solution was allowed to cool to room temperature and then added dropwise in 5 L of hexane to precipitate a polymer. The solid obtained by filtration was dissolved in 600 ml of acetone and again added dropwise in 5 L of hexane and after filtration, the solid obtained was dried under reduced pressure to obtain 150.6 g of a (3-methoxy-4-acetoxystyrene)-(4-acetoxystyrene) copolymer.

In a reaction vessel, 130 g of the polymer obtained above, 500 ml of methanol, 500 ml of 1-methoxy-2-propanol, 2.0 ml of concentrated hydrochloric acid and 30 ml of distilled water were added and heated at 80° C., followed by stirring for 5 hours. The reaction solution was allowed to cool to room temperature and added dropwise in 3 L of distilled water. The solid obtained by filtration was dissolved in 120 ml of acetone and again added dropwise in 3 L of distilled water and after filtration, the solid obtained was dried under reduced pressure to obtain 79.3 g of Polymer 1a. The weight average molecular weight by GPC was 8,000, the molecular weight dispersity was 1.56, and the compositional ratio determined by 1H-NMR was 51/49 from the left in the figure.

Synthesis Example 2

Synthesis of Polymer 1b

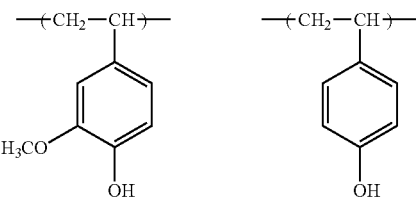

In a reaction vessel, 111.2 g (0.5 mol) of 3-methoxy-4-(1-ethoxyethoxy)styrene purified by distillation and 96.1 g (0.5 mol) of 4-(1-ethoxyethoxy)styrene (produced by Tosoh Corp.) were dissolved in 500 ml of dehydrated tetrahydrofuran. While stirring the resulting solution, a nitrogen gas was passed into the system and after cooling the system to −78° C., 0.02 mol of n-butyl lithium was added thereto and the polymerization was initiated. The polymerization degree was confirmed by sampling a part of the reaction solution every 30 minutes. When a desired polymerization degree was achieved, the polymerization was stopped by adding methanol to the reaction solution. After waiting until the reaction solution was cooled to room temperature, the reaction solution was added dropwise in 5 L of methanol to precipitate a polymer. The solid obtained by filtration was dissolved in 300 ml of acetone and again added dropwise in 5 L of methanol and after filtration, the solid obtained was dried under reduced pressure to obtain 153.4 g of a [3-methoxy-4-(1-ethoxyethoxy)styrene]-[4-(1-ethoxyethoxy)styrene] copolymer.

In a reaction vessel, 150 g of the polymer obtained above, 700 ml of tetrahydrofuran, 300 ml of methanol, 20 ml of distilled water and 1.0 g of p-toluenesulfonic acid were added and stirred at room temperature for 5 hours. Thereafter, the reaction solution was added dropwise in 4 L of distilled water. The solid obtained by filtration was dissolved in 300 ml of acetone and again added dropwise in 4 L of distilled water and after filtration, the solid obtained was dried under reduced pressure to obtain 78.3 g of Polymer 1b. The weight average molecular weight by GPC was 8,000, the molecular weight dispersity was 1.09, and the compositional ratio determined by 1H-NMR was 50/50 from the left in the figure.

The raw material 3-methoxy-4-(1-ethoxyethoxy)styrene can be synthesized by deprotecting the acetyl group of 3-methoxy-4-acetoxystyrene (produced by Honshu Chemical Industry Co., Ltd.) in a usual manner and then protecting the phenolic OH with use of an ethyl vinyl ether in a usual manner.

Synthesis Example 3

Synthesis of Polymer A-1

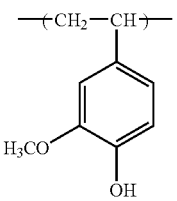

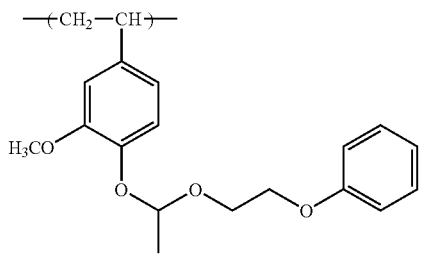

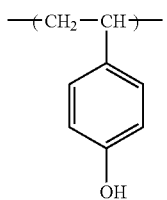

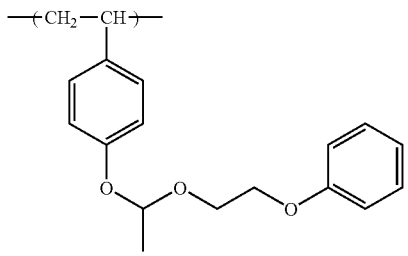

In a reaction vessel, 30 g of Polymer 1a obtained in Synthesis Example 1 or Polymer 1b obtained in Synthesis Example 2 was dissolved in 100 g of PGMEA. The resulting solution was depressurized to 20 mmHg at 60° C. to distill out about 20 g of the solvent together with water remaining in the system. After cooling to 20° C., 12.76 g of 2-phenoxyethyl vinyl ether and 1.0 g of p-toluenesulfonic acid were added and stirred at room temperature for 1 hour. Thereafter, 1.16 g of triethylamine was added to effect neutralization and then, a washing operation was performed three times by adding 40 g of ethyl acetate and 40 g of water. Subsequently, the amount of the solvent was adjusted to obtain a 30 mass % polymer solution. These polymers are designated as A-1a and A-1b, respectively. In Polymer A-1a, the weight average molecular weight by GPC was 8,800, the molecular weight dispersity was 1.57, and the compositional ratio determined from $^1$H and $^{13}$C-NMR analyses was 44/7/21/28 from the left in the figure. In Polymer A-1b, the weight average molecular weight by GPC was 8,500, the molecular weight dispersity was 1.10, and the compositional ratio determined from $^1$H and 13C-NMR analyses was 45/5/21/29 from the left in the figure.

Polymers A-2 to A-12 and A-27 to A-29 were obtained in the same manner as in Synthesis Examples 1, 2 and 3 except for changing the monomer used to a vinyl ether.

Synthesis Example 4

Synthesis of Polymer A-13

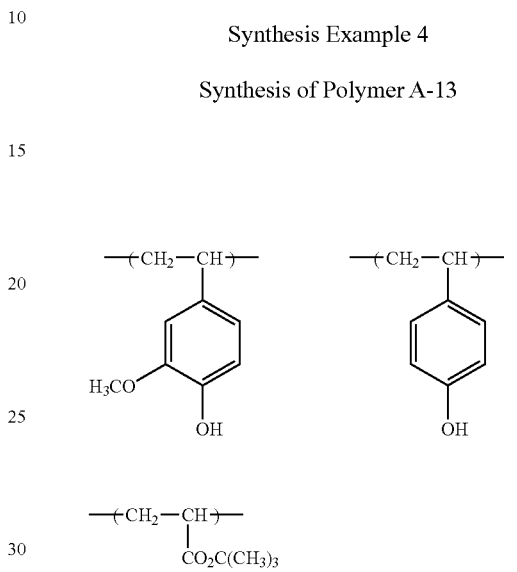

In a reaction vessel, 10.38 g (0.054 mol) of 3-methoxy-4-acetoxystyrene (produced by Honshu Chemical Industry Co., Ltd.), 7.46 g (0.046 mol) of 4-acetoxystyrene (produced by Honshu Chemical Industry Co., Ltd.) and 6.92 g (0.054 mol) of tert-butyl acrylate were dissolved in 60 ml of tetrahydrofuran. While stirring the resulting solution, a nitrogen gas was passed into the system. Subsequently, 2.76 g (0.012 mol) of polymerization initiator V-601 (produced by Wako Pure Chemical Industries, Ltd.) was added thereto and the reaction solution was heated at 65° C. After stirring under heat for 10 hours, the reaction solution was allowed to cool to room temperature and then added dropwise in 500 ml of hexane to precipitate a polymer. The solid obtained by filtration was dissolved in 40 ml of acetone and again added dropwise in 500 ml of hexane and after filtration, the solid obtained was dried under reduced pressure to obtain 21.79 g of a polymer.

In a reaction vessel, 20 g of the polymer obtained above, 200 ml of tetrahydrofuran, 30 ml of methanol, 10 ml of distilled water and 12.7 g of tetramethylammonium hydroxide were added and stirred at room temperature for 5 hours. The reaction solution was added dropwise in 500 ml of distilled water. The solid obtained by filtration was dissolved in 40 ml of acetone and again added dropwise in 500 ml of distilled water and after filtration, the solid obtained was dried under reduced pressure to obtain 12.0 g of Polymer A-13. The weight average molecular weight by GPC was 9,600, the molecular weight dispersity was 1.38, and the compositional ratio determined from $^1$H and $^{13}$C-NMR analyses was 34/30/36 from the left in the figure.

Polymers A-14 to A-26 were obtained in the same manner as in Synthesis Examples 4 and 5 except for changing the monomer used.

The structures of Polymers A-1 to A-29 are shown below.

TABLE 1
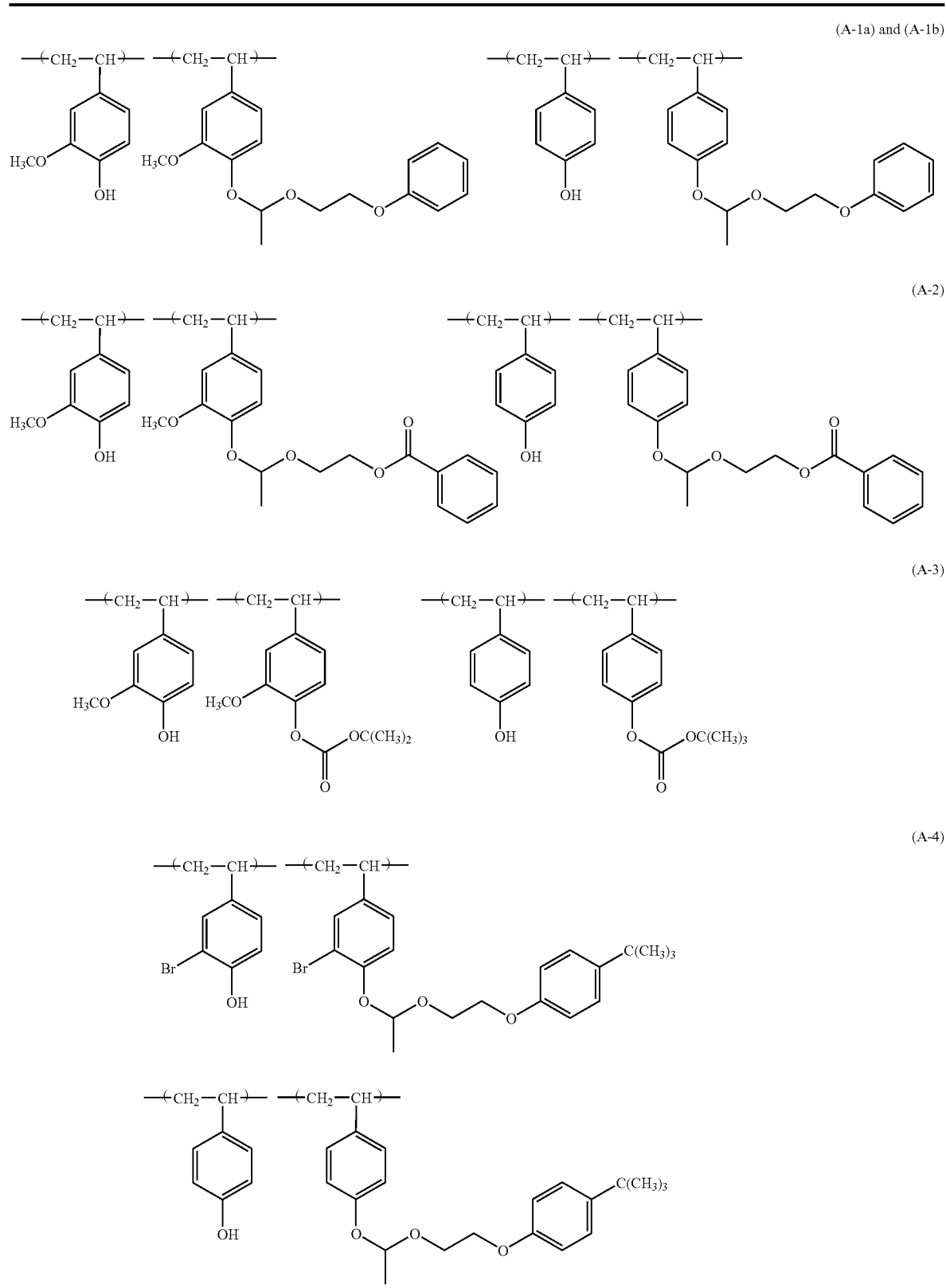

TABLE 1-continued
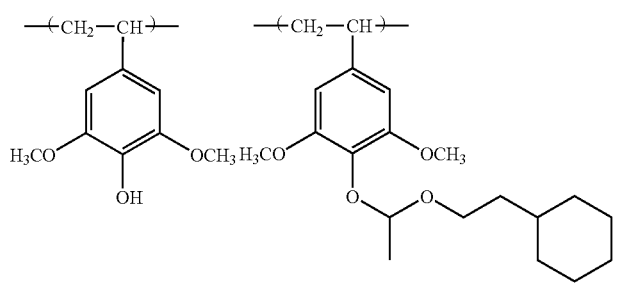
(A-5)
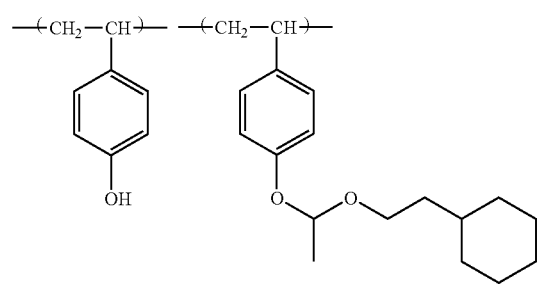
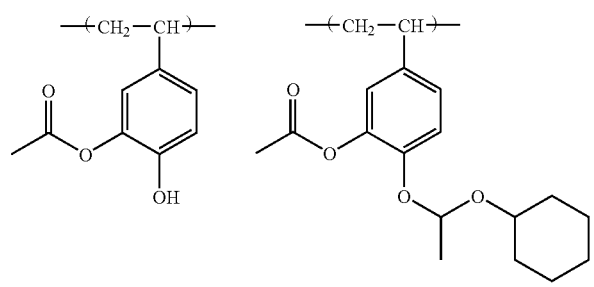
(A-6)
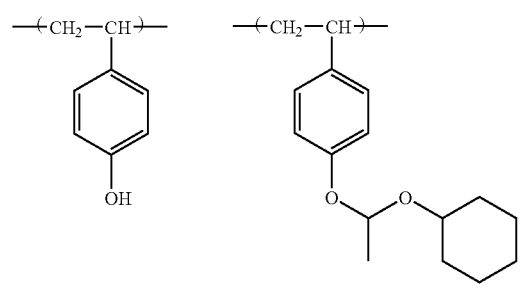
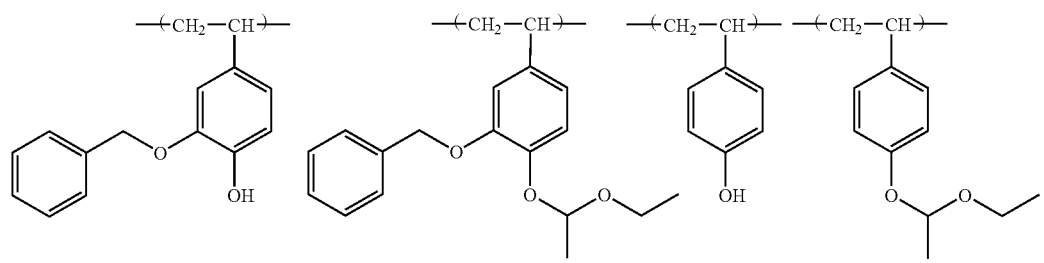
(A-7)

TABLE 1-continued
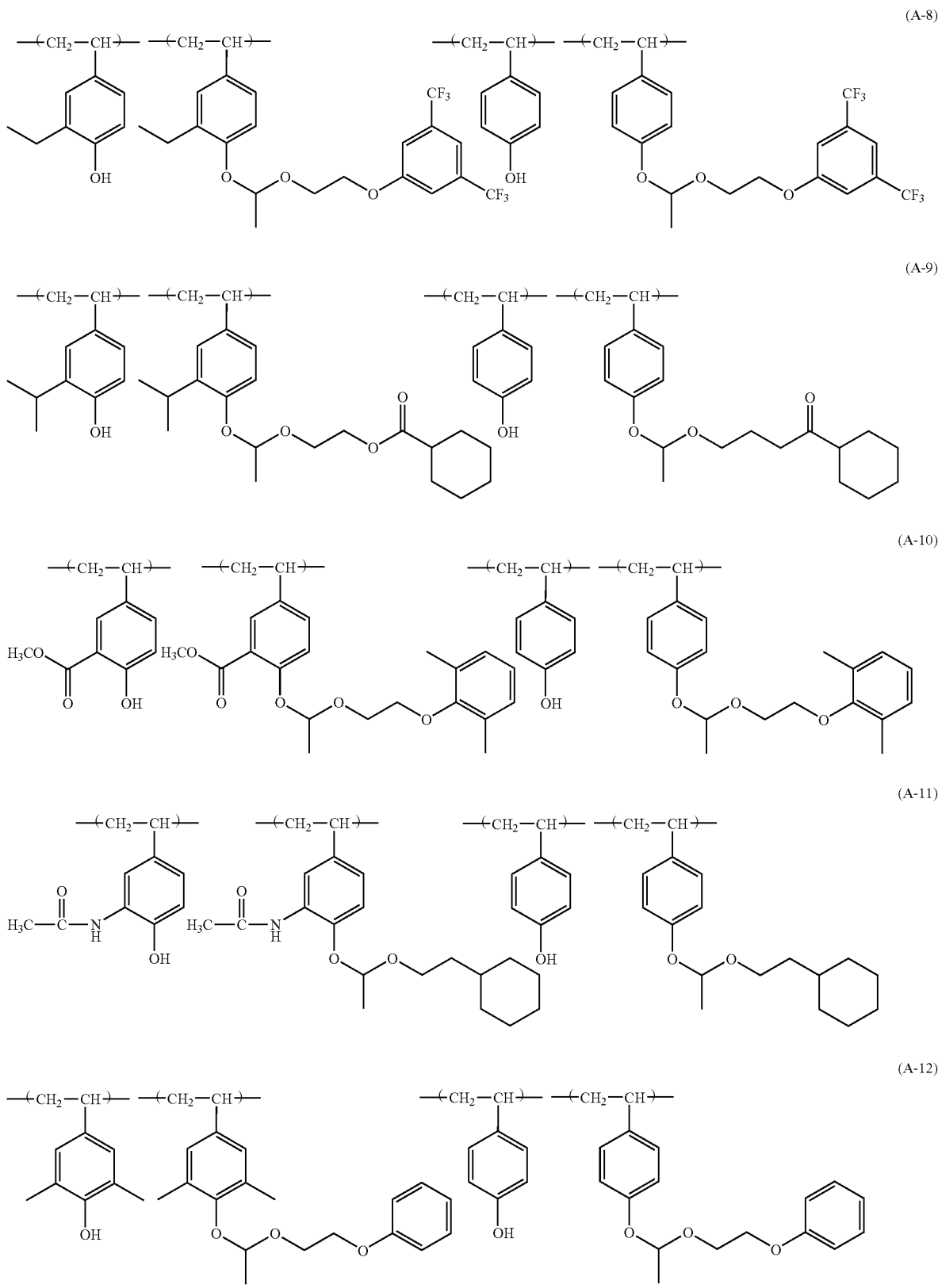

TABLE 1-continued
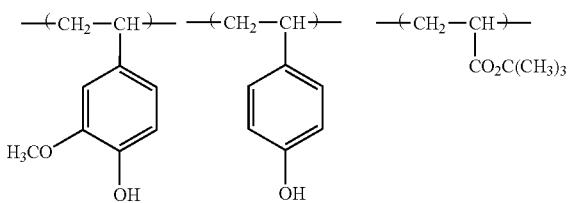
(A-13)
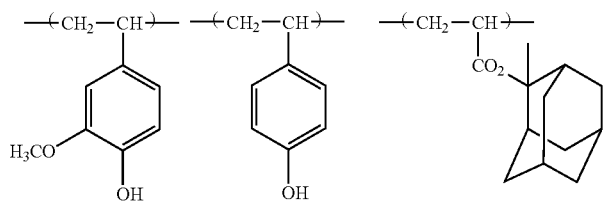
(A-14)
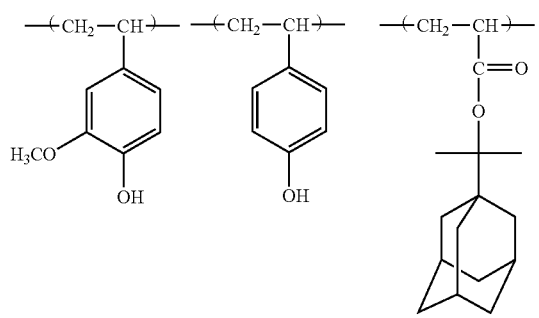
(A-15)
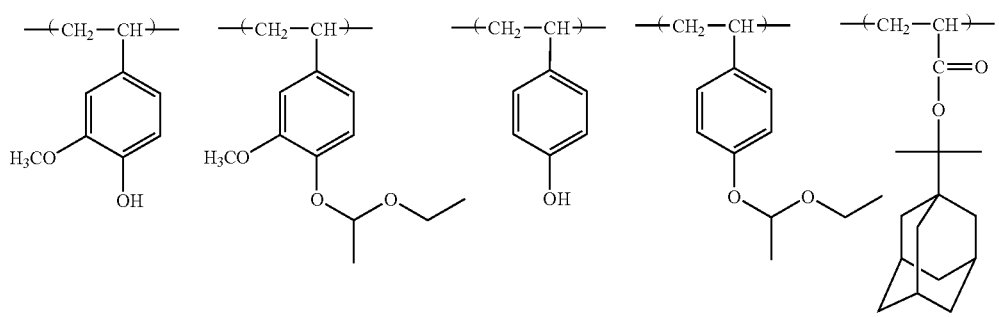
(A-16)
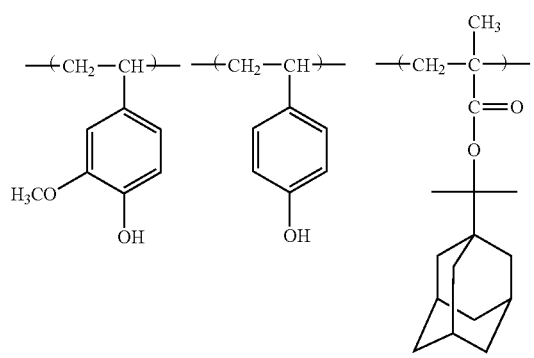
(A-17)

TABLE 1-continued
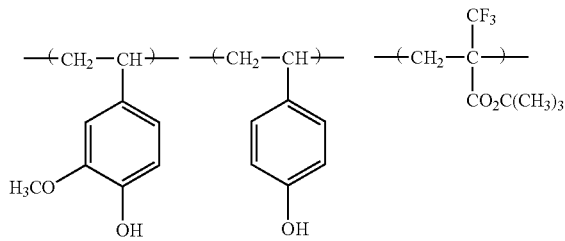
(A-18)
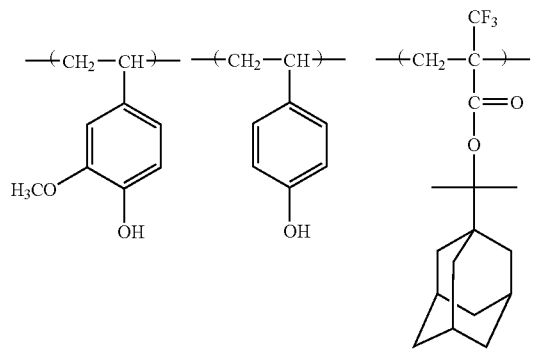
(A-19)
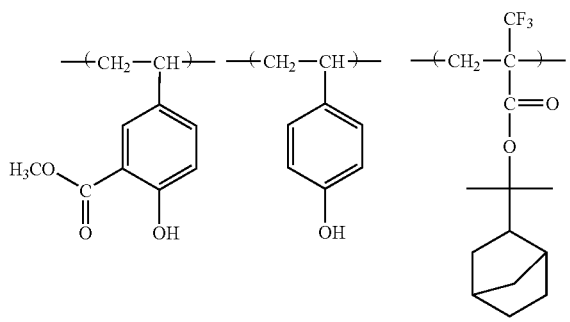
(A-20)
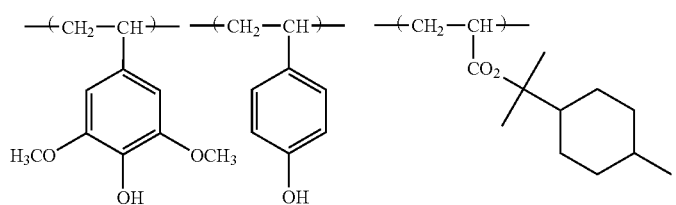
(A-21)
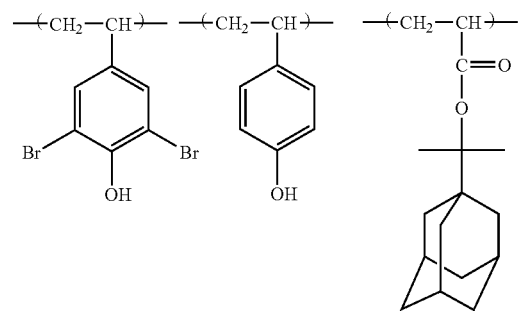
(A-22)

TABLE 1-continued
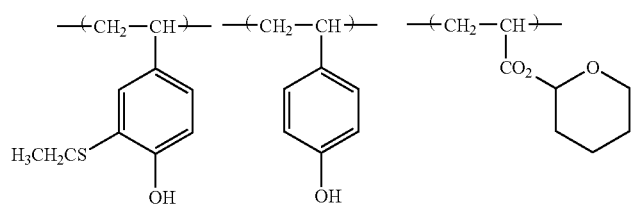
(A-23)
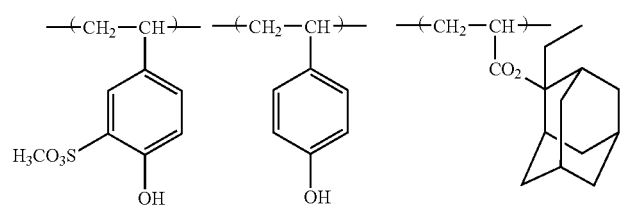
(A-24)
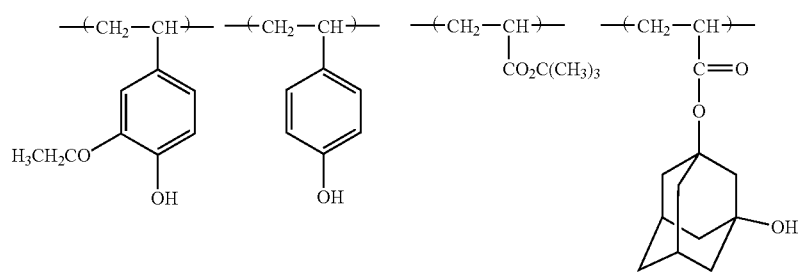
(A-25)
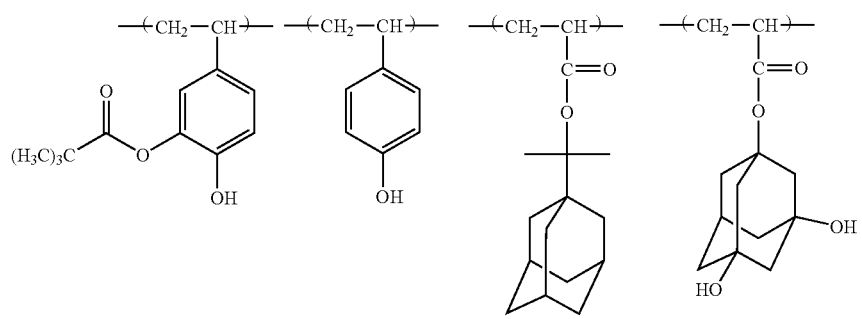
(A-26)
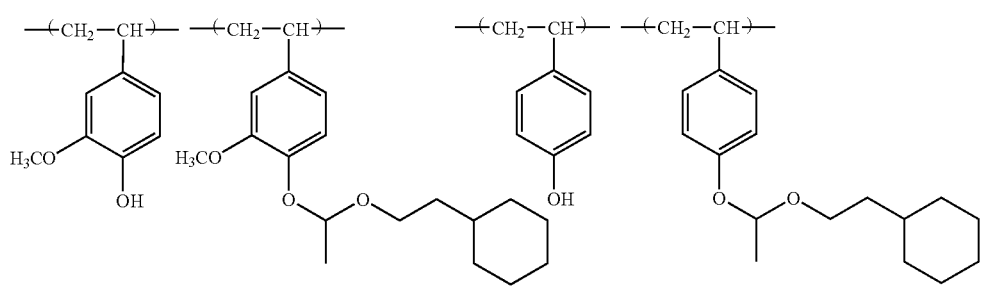
(A-27)

TABLE 1-continued
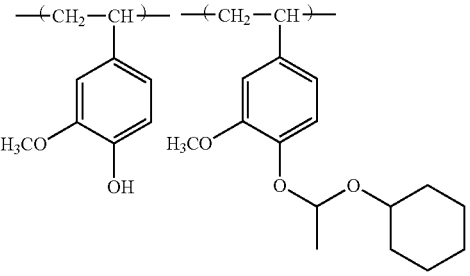
(A-28)
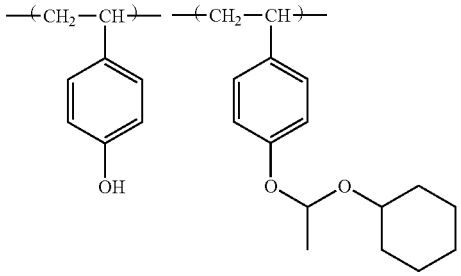
(A-29)
| Polymer | Weight Average Molecular Weight | Molecular Weight Dispersity | Compositional Ratio* |
|---|---|---|---|
| A-1a | 8800 | 1.57 | 44/7/21/28 |
| A-1b | 8500 | 1.10 | 45/5/21/29 |
| A-2 | 6600 | 1.51 | 45/5/19/31 |
| A-3 | 5300 | 1.12 | 46/4/29/21 |
| A-4 | 8400 | 1.42 | 47/3/33/17 |
| A-5 | 3600 | 1.51 | 47/3/27/23 |
| A-6 | 9900 | 1.65 | 46/4/25/25 |
| A-7 | 8500 | 1.25 | 46/4/14/36 |
| A-8 | 5400 | 1.23 | 44/6/28/22 |
| A-9 | 3300 | 1.55 | 46/4/29/21 |
| A-10 | 13700 | 1.43 | 47/3/25/25 |
| A-11 | 7700 | 1.47 | 48/2/28/22 |
| A-12 | 15800 | 1.08 | 46/4/21/29 |
| A-13 | 9600 | 1.38 | 34/30/36 |
| A-14 | 8300 | 1.54 | 35/30/30 |
| A-15 | 8700 | 1.57 | 34/31/35 |
| A-16 | 5100 | 1.35 | 32/2/21/10/35 |
| A-17 | 12700 | 1.33 | 36/32/32 |
| A-18 | 9000 | 1.58 | 34/36/30 |
| A-19 | 8700 | 1.48 | 34/38/28 |
| A-20 | 9900 | 1.12 | 39/32/29 |
| A-21 | 8300 | 1.57 | 29/41/30 |
| A-22 | 14200 | 1.42 | 28/44/28 |
| A-23 | 6300 | 1.49 | 27/41/32 |
| A-24 | 8600 | 1.16 | 29/40/31 |
| A-25 | 7900 | 1.52 | 15/40/30/15 |
| A-26 | 8500 | 1.48 | 26/39/25/10 |
| A-27 | 9700 | 1.45 | 46/4/29/21 |
| A-28 | 10500 | 1.48 | 45/S/21/29 |
| A-29 | 9800 | 1.5 | 48/2/38/12 |
*From the left of repeating units Resins H-1 and H-2 used as the comparative resin are shown below.

H-1:

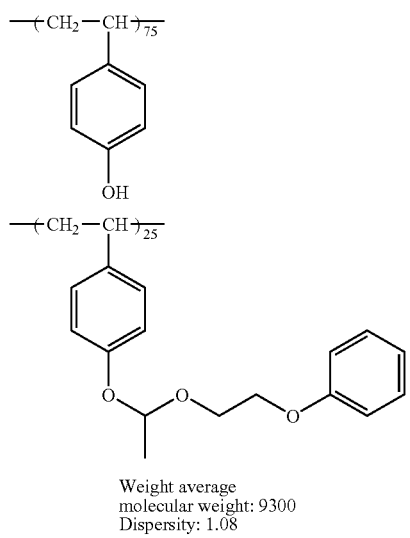

Weight average molecular weight: 9300
Dispersity: 1.08

H-2:

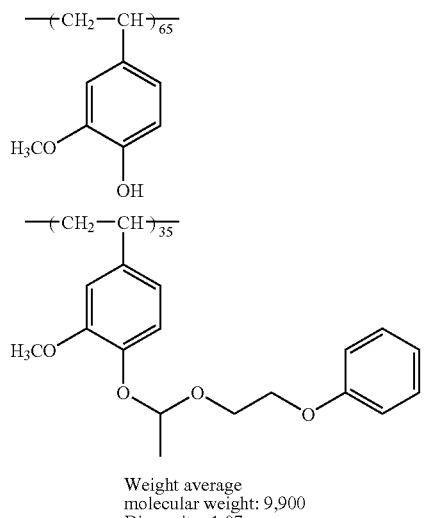

Weight average molecular weight: 9,900
Dispersity: 1.07

[Preparation of Resist Composition]

| Resin of the Invention shown in Table 2: | 0.948 g (as solid content) |
|---|---|
| Acid generator: | 0.05 g |
| Organic basic compound: | 0.003 g |
| Surfactant: | 0.002 |

These components were dissolved in 16.79 g of the solvent shown in Table 2 below to prepare a solution having a solid content concentration of 5.0 mass %. This solution was filtered through a 0.1-μm Teflon filter to obtain a positive resist solution.

[Particle]

The number of particles in the positive resist composition prepared above was countered by using a particle counter manufactured by Rion. That is, the number of particles of 0.2 μm or more in 1 ml of the resist solution was counted.

[Pattern Formation and Evaluation (EB)]

The thus-prepared positive resist solution was uniformly coated on a hexamethyldisilazane-treated silicon wafer by using a spin coater and dried under heat at 120° C. for 90 seconds to form a positive resist film having a film thickness of 0.3 μm. This resist film was then irradiated with electron beams by using an electron beam image-drawing apparatus (HL750, manufactured by Hitachi Ltd., accelerating voltage: 50 KeV). After the irradiation, the resist film was baked at 100° C. for 90 seconds, dipped in an aqueous 2.38 mass % tetramethylammonium hydroxide (TMAH) solution for 60 seconds, rinsed with water for 30 seconds and then dried. The obtained pattern was evaluated by the following methods.

[Resolution]

The cross-sectional profile of the pattern obtained was observed by using a scanning electron microscope (S-4300, manufactured by Hitachi, Ltd.). The minimum irradiation energy for resolving a 150-nm line (line:space=1:1) was defined as the sensitivity. The limiting resolution (the minimum line width where line and space were separated and resolved) at the irradiation dosage of giving the above-described sensitivity was defined as the resolution.

[Line Edge Roughness]

With respect to the region of 50 μm in the longitudinal direction of the 150 nm-line pattern at the irradiation dosage of giving the above-described sensitivity, the distance from a reference line where the edge should be present was measured at arbitrary 30 points by using a scanning electron microscope (S-9220, manufactured by Hitachi, Ltd.) and a standard deviation was determined to calculate 3σ.

The results are shown in Table 2.

TABLE 2

| | | Composition | | | | Evaluation | | |
|---|---|---|---|---|---|---|---|---|
| | Polymer of Invention | Acid Generator (weight ratio) | Basic Compound | Surfactant | Solvent (weight ratio) | Resolution (nm) | Line Edge Roughness (nm) | Particles (number/ml) |
| Example | | | | | | | | |
| 1 | A-1a | B-1 | N-1 | D-1 | S-1 | 70 | 4.2 | 46 |
| 2 | A-1b | B-1 | N-2 | D-2 | S-1 | 70 | 4.2 | 41 |
| 3 | A-2 | B-1 | N-2 | D-2 | S-1 | 70 | 4.2 | 37 |
| 4 | A-3 | B-1 | N-2 | D-4 | S-1 | 70 | 4.6 | 52 |
| 5 | A-4 | B-1 | N-2 | D-2 | S-1 | 70 | 4.3 | 45 |
| 6 | A-5 | B-1/B-3 (90/10) | N-2 | D-1 | S-1 | 65 | 3.9 | 38 |

TABLE 2-continued

| | Composition | | | | | Evaluation | | |
|---|---|---|---|---|---|---|---|---|
| | | | | | | | Line Edge | |
| | Polymer of Invention | Acid Generator (weight ratio) | Basic Compound | Surfactant | Solvent (weight ratio) | Resolution (nm) | Roughness (nm) | Particles (number/ml) |
| 7 | A-6 | B-2 | N-1 | D-2 | S-1/S-2 (70/30) | 65 | 4.1 | 39 |
| 8 | A-7 | B-2 | N-1 | D-2 | S-1 | 70 | 4.4 | 51 |
| 9 | A-8 | B-2 | N-1 | D-2 | S-1 | 70 | 4.5 | 44 |
| 10 | A-9 | B-2 | N-3 | D-3 | S-1 | 70 | 4.6 | 47 |
| 11 | A-10 | B-2/B-4 (85/15) | N-3 | D-3 | S-1 | 65 | 4.2 | 36 |
| 12 | A-11 | B-2 | N-3 | D-4 | S-1 | 70 | 4.3 | 43 |
| 13 | A-12 | B-2 | N-2 | D-2 | S-1 | 65 | 4 | 37 |
| 14 | A-13 | B-1 | N-1 | D-3 | S-1 | 75 | 4.6 | 56 |
| 15 | A-14 | B-1 | N-2 | D-3 | S-1 | 70 | 4.3 | 45 |
| 16 | A-15 | B-1 | N-1 | D-2 | S-1 | 70 | 4.2 | 42 |
| 17 | A-16 | B-1 | N-2 | D-3 | S-1 | 70 | 4.3 | 44 |
| 18 | A-17 | B-1 | N-3 | D-3 | S-1 | 70 | 4.3 | 47 |
| 19 | A-18 | B-2 | N-2 | D-2 | S-1 | 75 | 4.6 | 53 |
| 20 | A-19 | B-2 | N-2 | D-2 | S-1 | 70 | 4.3 | 44 |
| 21 | A-20 | B-2 | N-3 | D-2 | S-1 | 70 | 4.3 | 46 |
| 22 | A-21 | B-2 | N-1 | D-1 | S-1 | 70 | 4.4 | 45 |
| 23 | A-22 | B-1 | N-3 | D-2 | S-1 | 70 | 4.4 | 43 |
| 24 | A-23 | B-1 | N-1 | D-1 | S-1 | 70 | 4.3 | 47 |
| 25 | A-24 | B-1 | N-3 | D-2 | S-1/S-2 (70/30) | 65 | 3.9 | 35 |
| 26 | A-25 | B-1 | N-1 | D-2 | S-1 | 70 | 4.3 | 42 |
| 27 | A-26 | B-1 | N-2 | D-3 | S-1/S-2 (90/10) | 65 | 4 | 36 |
| 28 | A-27 | B-1 | N-1 | D-1 | S-1/S-2 (80/20) | 65 | 4.1 | 35 |
| 29 | A-28 | B-1 | N-1 | D-1 | S-1/S-2 (80/20) | 70 | 4.2 | 33 |
| 30 | A-29 | B-1 | N-1 | D-1 | S-1/S-2 (80/20) | 70 | 4.0 | 34 |
| Comparative Example | | | | | | | | |
| 1 | A-1b | B-1 | — | D-1 | S-1 | 90 | 7.3 | 78 |
| 2 | H-1 | B-1 | N-1 | D-1 | S-1 | 90 | 9.1 | 158 |
| 3 | H-2 | B-1 | N-1 | D-1 | S-1 | 80 | 5.2 | 66 |

The abbreviations in Table 2 are shown below.

B-1:

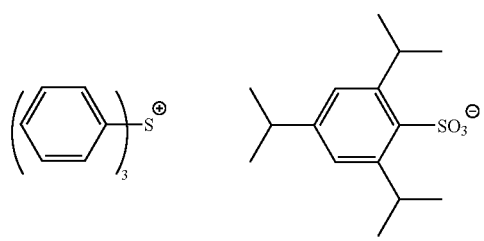

B-2:

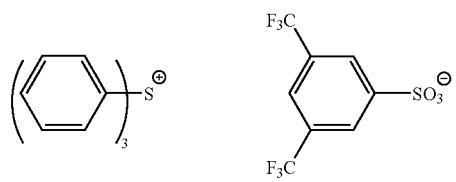

B-3:

TABLE 2-continued

| | Composition | | | | Evaluation | | |
|---|---|---|---|---|---|---|---|
| | | | | | | Line Edge | |
| Polymer of Invention | Acid Generator (weight ratio) | Basic Compound | Surfactant | Solvent (weight ratio) | Resolution (nm) | Roughness (nm) | Particles (number/ml) |

B-4:

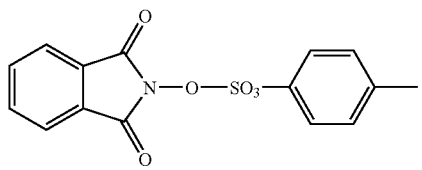

[Surfactant]
D-1: Megafac F176 (produced by Dainippon Ink & Chemicals, Inc.)
D-2: Megafac R08 ((produced by Dainippon Ink & Chemicals, Inc.)
D-3: Troysol S-366 (produced by Troy Chemical Industries, Inc.)
D-4: polyoxyethylene lauryl ether
[Solvent]
S-1: propylene glycol monomethyl ether acetate
S-2: propylene glycol monomethyl ether
[Basic Compound]
N-1: trioctylamine
N-2: 1,5-diazabicyclo[4.3.0]-5-nonene
N-3: 2,4,6-triphenylimidazole As seen from the results in Table 2, in the pattern formation by the irradiation of electron beams, the resist composition of the present invention ensures high resolution and excellent line edge roughness as compared with the composition of Comparative Examples.

[Pattern Formation and Evaluation (EUV)]

Using each resist composition of Examples 2, 6, 7, 25 and 28 and Comparative Examples 1, 2 and 3, a resist film was obtained in the same manner as in Example 1. However, the resist film thickness was 0.15 μm here. The resist film obtained was subjected to surface exposure by using EUV light (wavelength: 13 nm) while changing the exposure dosage in steps of 0.5 mJ in the range from 0 to 10.0 mJ and then baked at 100° C. for 90 seconds. Thereafter, the dissolution rate at each exposure dosage was measured by using an aqueous 2.38% tetramethylammonium hydroxide (TMAH) solution to obtain a sensitivity curve. The exposure dosage when the dissolution rate of the resist was saturated in this sensitivity curve was defined as the sensitivity and also, the dissolution contrast (γ value) was calculated from the gradient of the straight line part in the sensitivity curve. As the γ value is larger, the dissolution contrast is more excellent. These results are shown in Table 3 as Examples 28 to 32 and Comparative Examples 4, 5 and 6, respectively.

TABLE 3

| | Sensitivity (mJ/cm$^2$) | γ Value |
|---|---|---|
| Example 28 | 2.0 | 10.3 |
| Example 29 | 2.0 | 10.8 |
| Example 30 | 1.5 | 10.7 |
| Example 31 | 2.0 | 10.9 |
| Example 32 | 2.0 | 10.5 |
| Comparative Example 4 | 3.5 | 8.8 |
| Comparative Example 5 | 4.0 | 7.1 |
| Comparative Example 6 | 2.5 | 9.0 |

As seen from the results in Table 3, in the characteristic evaluation by the irradiation of EUV light, the resist composition of the present invention ensures high sensitivity and high contrast and is superior to the composition of Comparative Examples.

This application is based on Japanese patent application JP 2004-255473, filed on Sep. 2, 2004, the entire content of which is hereby incorporated by reference, the same as if set forth at length.

What is claimed is

1. A positive resist composition comprising:
(A) a resin of which solubility in an alkali developer increases under the action of an acid, the resin having a repeating unit represented by formula (I) and a repeating unit represented by formula (IIa),
(B) a compound of generating an acid upon irradiation with actinic rays or radiation, and
(C) an organic basic compound:

(I)

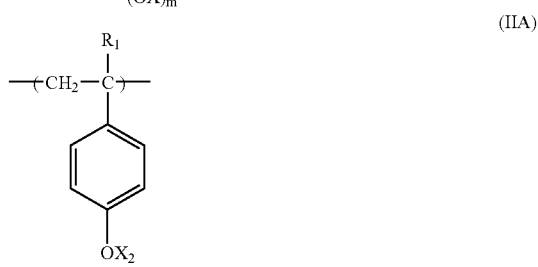

(IIA)

wherein
- $R_1$ represents a hydrogen atom, a methyl group, a cyano group, a halogen atom or a perfluoro group,
- $R_2$ represents a non-acid-decomposable group, selected from the group consisting of a halogen atom, a cyclolkyl group, an aryl group, an alkoxy group, an acyl group, —OC(=O)Ra, —OC(=O)ORa, —C(=O)Ra, —C(=O)N(Rb)Ra, —N(Rb)C(=O)Ra, —N(Rb)C(=O)ORa, —N(Rb)SO$_2$Ra, —SRa, —SO$_2$Ra, —SO$_3$Ra and —SO$_2$N(Rb)Ra in which Ra represents an alkyl group, a cycloalkyl group or an aryl group and Rb represents a hydrogen atom, an alkyl group, a cycloalkyl group or an aryl group,
- X represents a hydrogen atom or an organic group,
- m represents an integer of 1 to 4,
- n represents an integer of 1 to 4, provided that $2 \leq n+m \leq 5$,
- when m is an integer of 2 to 4, multiple Xs may be the same or different,
- when n is an integer of 2 to 4, multiple $R_2$s may be the same or different, and
- $R_1$ in formula (IIa) may be the same as or different from $R_1$ in formula (I), respectively, and $X_2$ represents a hydrogen atom or an acid-decomposable group.

2. The positive resist composition as claimed in claim 1, wherein the repeating unit represented by formula (I) is a repeating unit represented by formula (Ia):

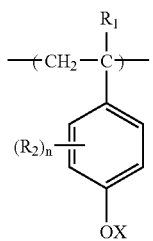

(Ia)

wherein
- $R_1$ represents a hydrogen atom, a methyl group, a cyano group, a halogen atom or a perfluoro group,
- $R_2$ represents a non-acid-decomposable group,
- X represents a hydrogen atom or an organic group,
- n represents an integer of 1 to 4, and
- when n is an integer of 2 to 4, multiple $R_2$s may be the same or different.

3. The positive resist composition as claimed in claim 1, wherein the repeating unit represented by formula (I) is a repeating unit represented by formula (Ib):

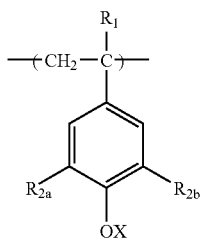

(Ib)

wherein
- $R_1$ represents a hydrogen atom, a methyl group, a cyano group, a halogen atom or a perfluoro group,
- X represents a hydrogen atom or an organic group, and
- $R_{2a}$ and $R_{2b}$ each independently represents a hydrogen atom or a non-acid-decomposable group, provided that at least one of $R_{2a}$ and $R_{2b}$ represents a non-acid-decomposable group.

4. The positive resist composition as claimed in claim 1, wherein the non-acid-decomposable group represented by $R_2$ in formula (I) contains an oxygen atom.

5. The positive resist composition as claimed in claim 1, wherein the non-acid-decomposable group represented by $R_2$ in formula (I) contains a halogen atom.

6. The positive resist composition as claimed in claim 1, wherein the resin (A) further contains a repeating unit represented by formula (III):

(III)

wherein
- $R_3$ to $R_5$ each independently represents a hydrogen atom, a fluorine atom, a chlorine atom, a cyano group or an alkyl group, and
- $X_1$ represents a hydrogen atom or an organic group.

7. The positive resist composition as claimed in claim 6, wherein at least one of X in formula (I), $X_2$ formula (IIa) and $X_1$ in formula (III) contains at least one of an alicyclic structure and an aromatic ring structure.

8. The positive resist composition as claimed in claim 1, wherein the non-acid-decomposable group represented by $R_2$ in formula (I) is an alkoxy group.

9. The positive resist composition as claimed in claim 1, which further comprises (D) a surfactant.

10. The positive resist composition as claimed in claim 1, which comprises (B1) a compound of generating an organic sulfonic acid under the action of actinic rays or radiation as the compound (B).

11. The positive resist composition as claimed in claim 10, which further comprises (B2) a compound of generating a carboxylic acid under the action of actinic rays or radiation.

12. The positive resist composition as claimed in claim 1, which further comprises a solvent.

13. The positive resist composition as claimed in claim 12, wherein the solvent contains a propylene glycol monomethyl ether acetate.

14. The positive resist composition as claimed in claim 13, wherein the solvent further contains a propylene glycol monomethyl ether.

15. A pattern forming method comprising forming a resist film by using the resist composition claimed in claim 1, and exposing and developing said resist film.

16. The pattern forming method of claim 15 wherein the resist film is exposed by irradiation of electron beam, X-ray or EUV.

17. The positive resist composition of claim 1 wherein in formula (IIa), $X_2$ is a hydrogen atom.

* * * * *